US007495298B2

United States Patent
Hayashi et al.

(10) Patent No.: US 7,495,298 B2
(45) Date of Patent: Feb. 24, 2009

(54) INSULATING BUFFER FILM AND HIGH DIELECTRIC CONSTANT SEMICONDUCTOR DEVICE AND METHOD FOR FABRICATING THE SAME

(75) Inventors: Shigenori Hayashi, Nara (JP); Riichiro Mitsuhashi, Nara (JP)

(73) Assignees: Panasonic Corporation, Osaka (JP); Interuniversitair Micro-Elektronica Centrum VZW, Leuven (BE)

( * ) Notice: Subject to any disclaimer, the term of this patent is extended or adjusted under 35 U.S.C. 154(b) by 0 days.

(21) Appl. No.: 11/371,253

(22) Filed: Mar. 9, 2006

(65) Prior Publication Data

US 2007/0007564 A1 Jan. 11, 2007

(30) Foreign Application Priority Data

Jun. 9, 2005 (JP) ............................. 2005-170208

(51) Int. Cl.
  *H01L 29/94* (2006.01)
(52) U.S. Cl. ............................... 257/412; 257/E29.161
(58) Field of Classification Search ............ 257/E29.16, 257/E29.161, 410, 412
See application file for complete search history.

(56) References Cited

U.S. PATENT DOCUMENTS

| 3,386,016 | A | * | 5/1968 | Lindmayer | .................. 257/407 |
| 5,292,673 | A | * | 3/1994 | Shinriki et al. | ............... 438/287 |
| 6,376,888 | B1 | * | 4/2002 | Tsunashima et al. | ........ 257/407 |
| 2004/0038435 | A1 | | 2/2004 | Wieczorek et al. | |
| 2004/0084734 | A1 | * | 5/2004 | Matsuo | ........................ 257/407 |
| 2006/0263961 | A1 | * | 11/2006 | Kittl et al. | ................... 438/199 |

OTHER PUBLICATIONS

Lauwers et al., "CMOS Integration of Dual Work Function Phase Controlled Ni FUSI with Simultaneous Silicidation of NMOS (NiSi) and PMOS (Ni-rich silicide) Gates on HfSiON," Electron Devices Meeting, 2005. IEDM Technical Digest. IEEE International, Dec. 5-7, 2005.*

Hiratani, M., et al. "Effective Electron Mobility Reduced by Remote Charge Scattering in High-k Gate Stacks" Jpn. J. Appl. Phys. 2002 vol. 41, pp. 4521-4522.

(Continued)

*Primary Examiner*—Thomas L Dickey
(74) *Attorney, Agent, or Firm*—McDermott Will & Emery LLP

(57) ABSTRACT

A semiconductor device includes: an n-transistor including a first gate insulating film made of a high-dielectric-constant material and a first gate electrode fully silicided with a metal, the first gate insulating film and the first gate electrode being formed in this order over a semiconductor region; and a p-transistor including a second gate insulating film made of the high-dielectric-constant material and a second gate electrode fully silicided with the metal, the second gate insulating film and the second gate electrode being formed in this order over the semiconductor region. If the metal has a work function larger than a Fermi level in potential energy of electrons of silicon, a metal concentration of the second gate electrode is higher than that of the first gate electrode whereas if the metal has a work function smaller than the Fermi level of silicon, a metal concentration of the second gate electrode is lower than that of the first gate electrode.

7 Claims, 11 Drawing Sheets

OTHER PUBLICATIONS

Hobbs, C., et al. "Fermi Level Pinning at the PolySi/Metal Oxide Interface" Proceedings of the 2003 Symposium on VLSI Technology, 2003, pp. 9-10.

Takahashi, K., et al. "Dual Workfuction Ni-Silicide/HfSiON Gate Stacks by Phase-Controlled Full-Silicidation (PC-FUSI) Technique for 45nm-node LSTP and LOP Devices" IEDM Tech. Dig., 2004, pp. 91-94.

Park, C., et al. "Substituted Aluminum Metal Gate on High-K Dielectric for Low Work-Function and Fermi-Level Pinning Free" IEDM Tech. Dig., 2004, pp. 299-302.

European Search Report issued in European Patent Application No. EP 06 00 6438, mailed Oct. 30, 2008.

Nabatame, T., et al., Partial Silicides Technology for Tunable Work Function Electrodes on High-k Gate Dielectrics—Fermi Level Pinning Controlled $PtSi_x$ for $HfO_x$ (N) pMOSFET, 2004.

Cabral, C., et al., "Dual Workfunction Fully Silicided Metal Gates", 2004 Symposium on VLSI Technology Digest of Technical Papers, Jun. 2004, pp. 184-185.

* cited by examiner

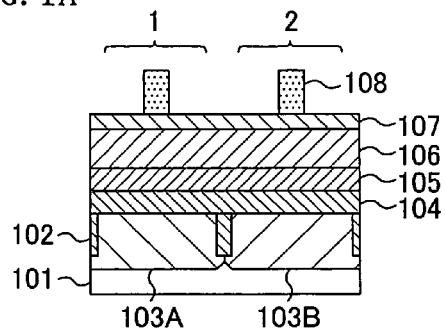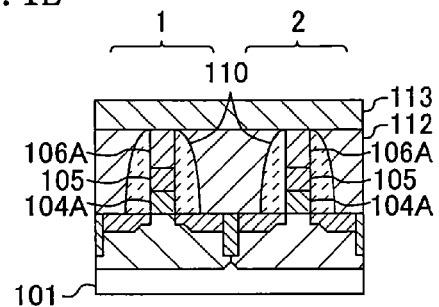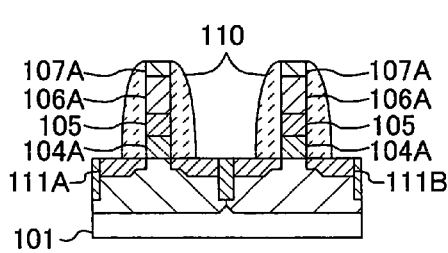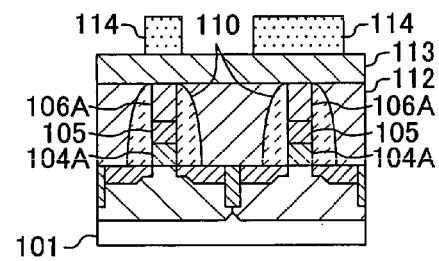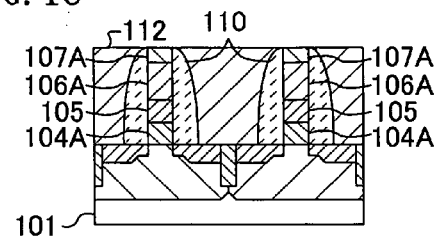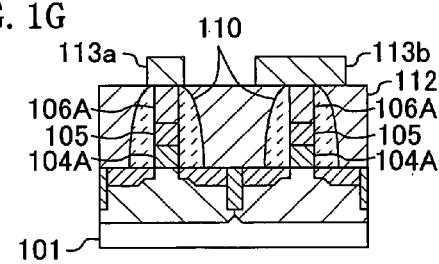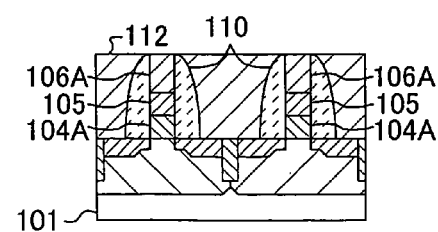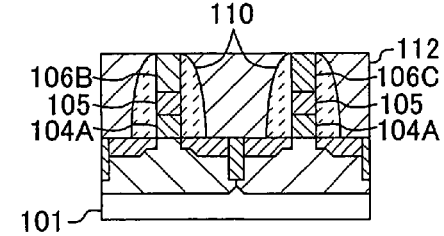

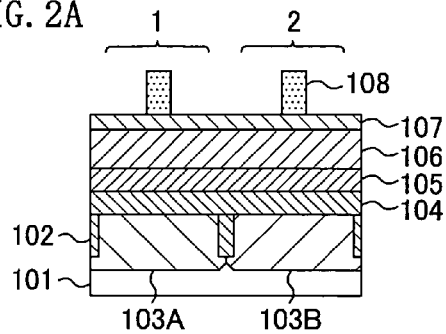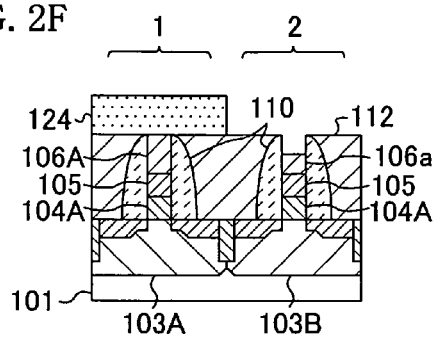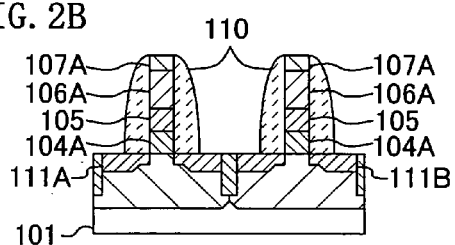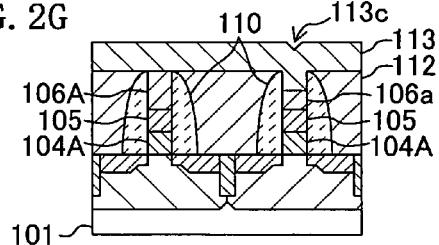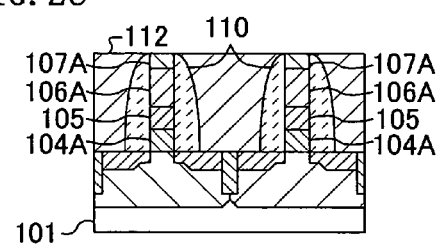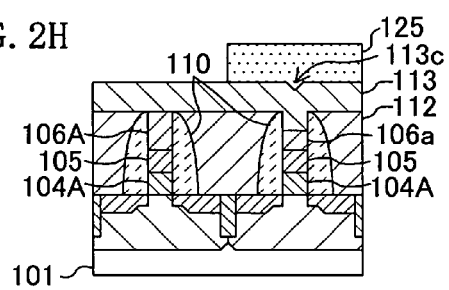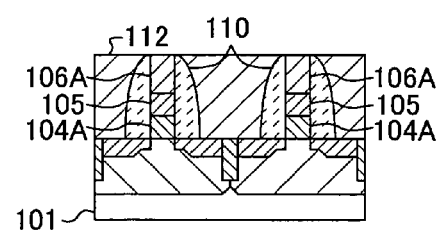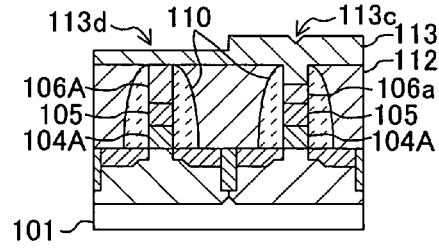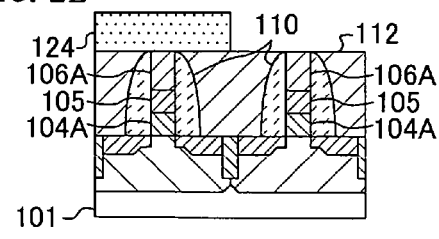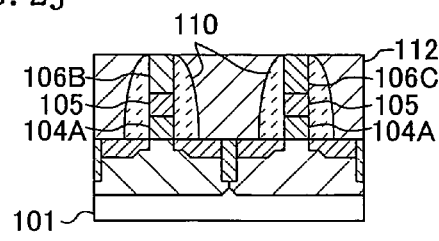

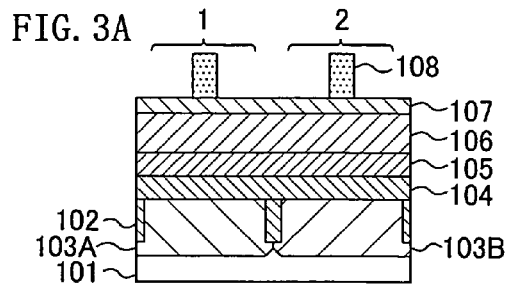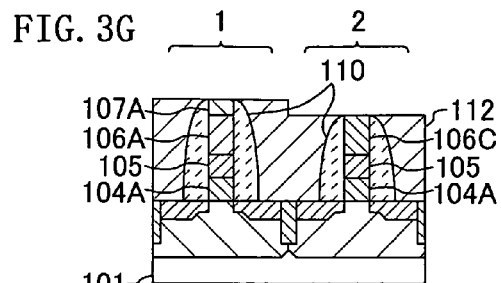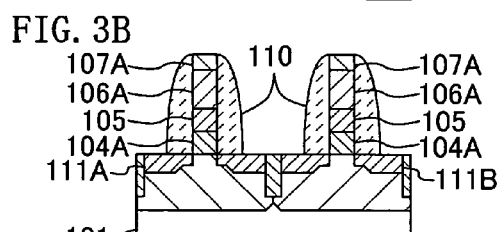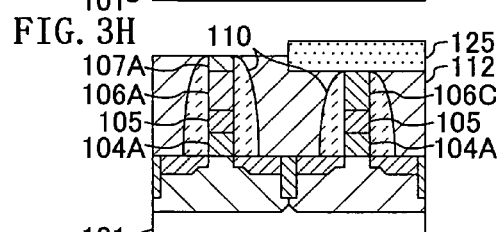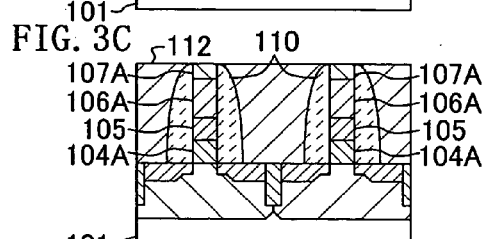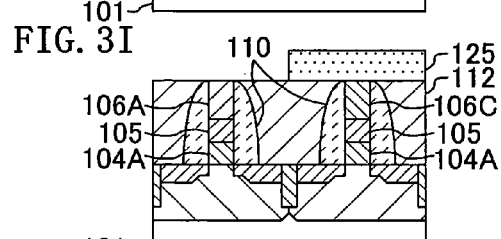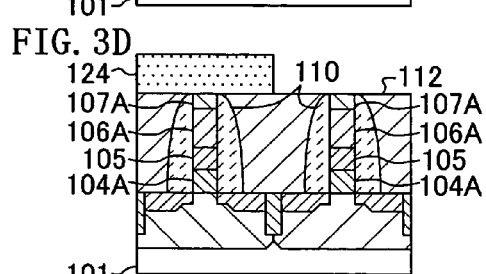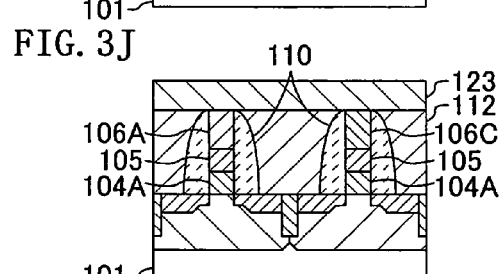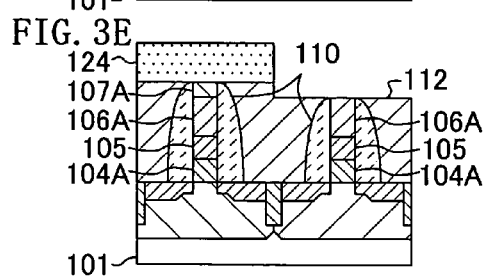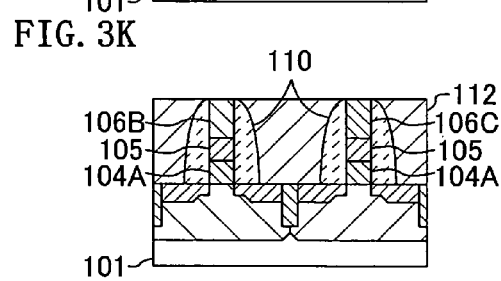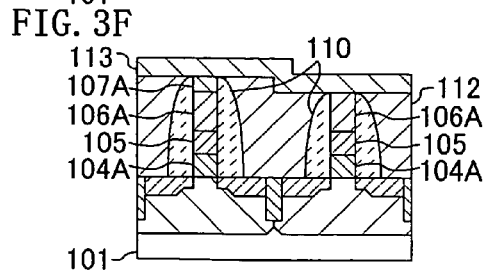

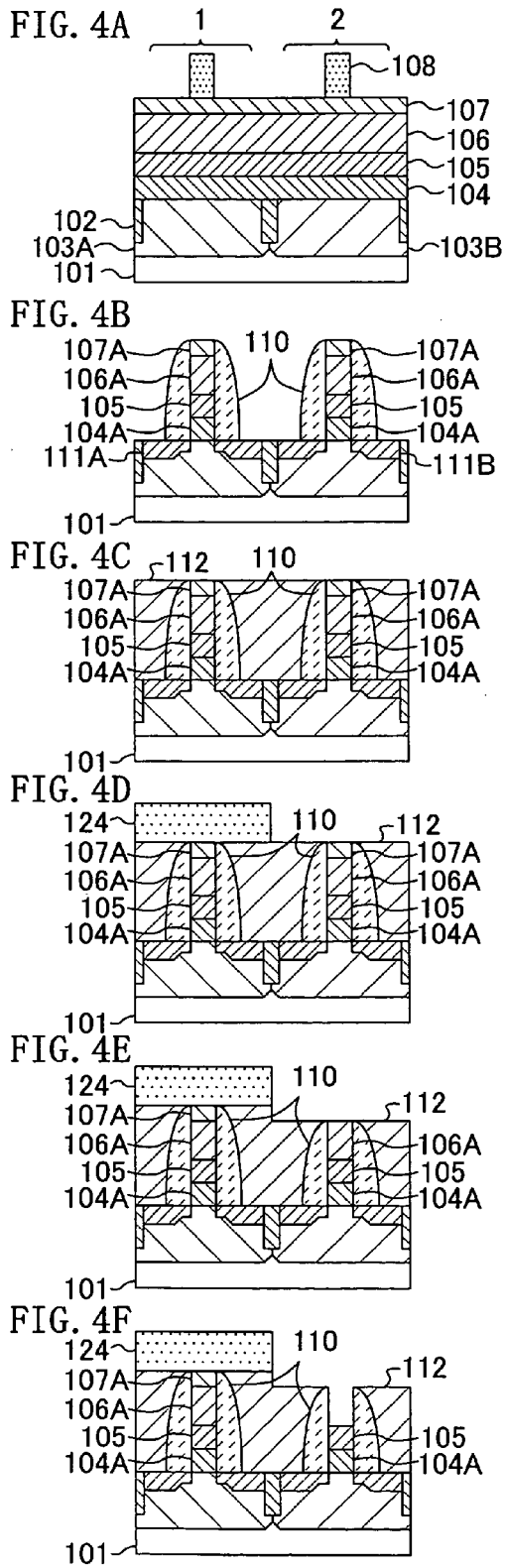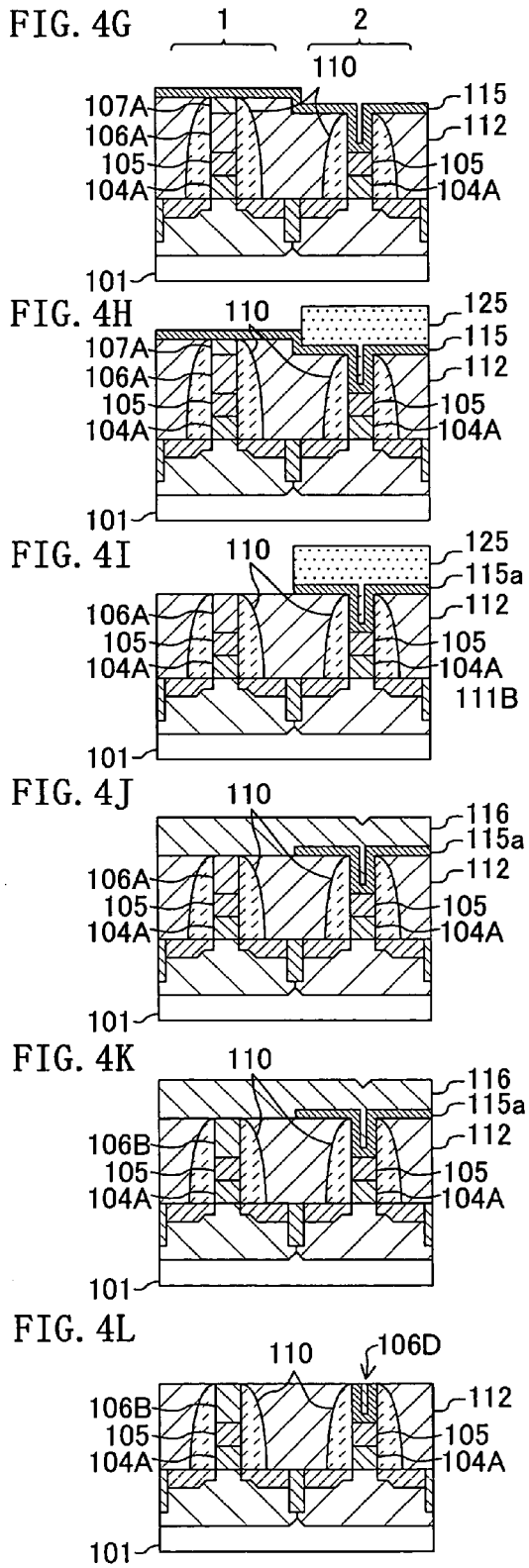

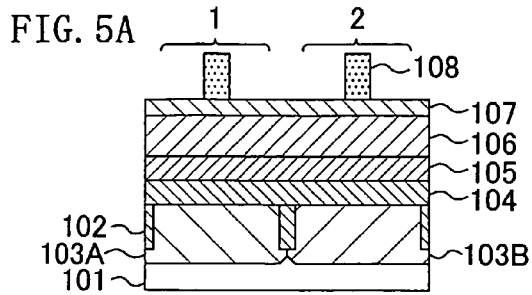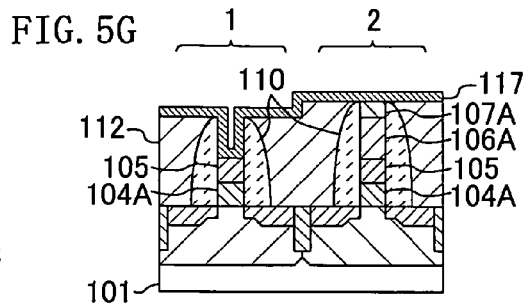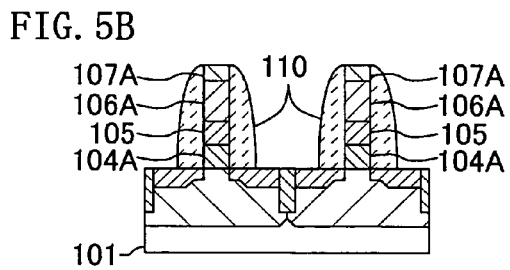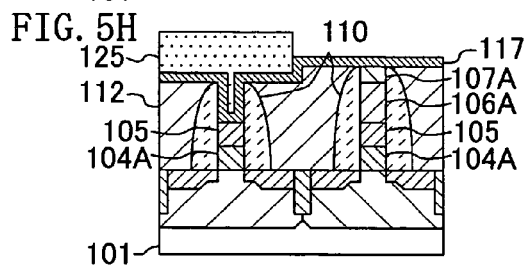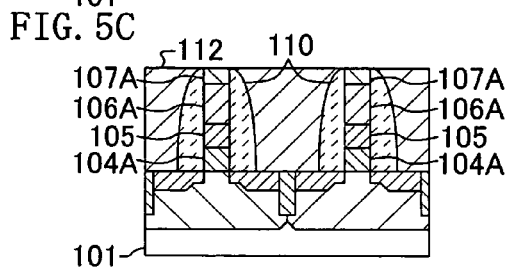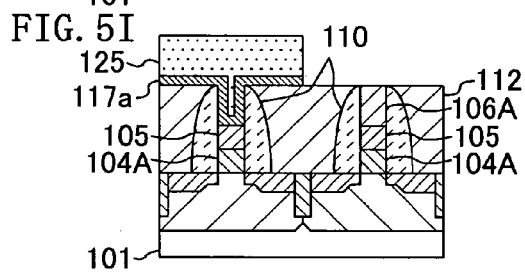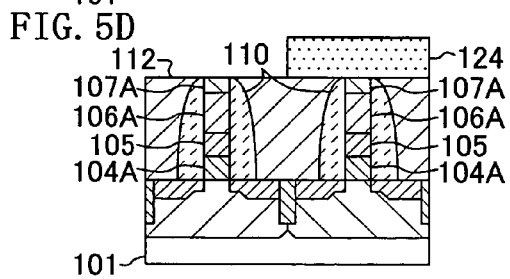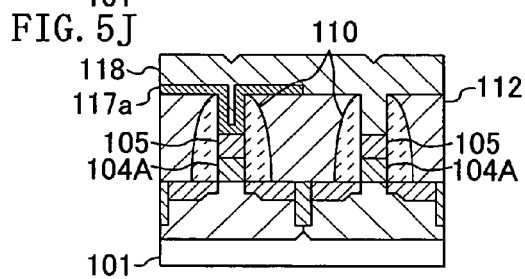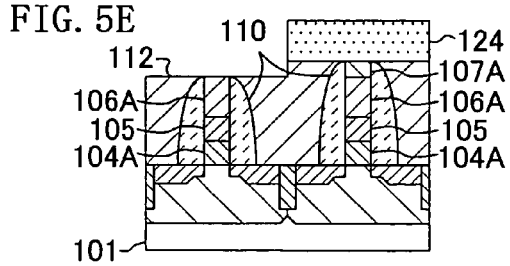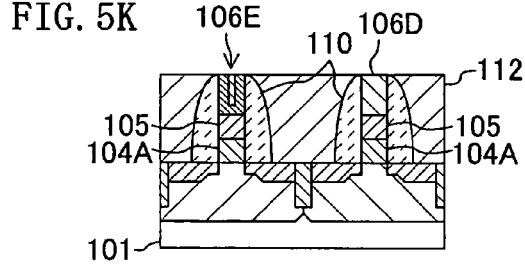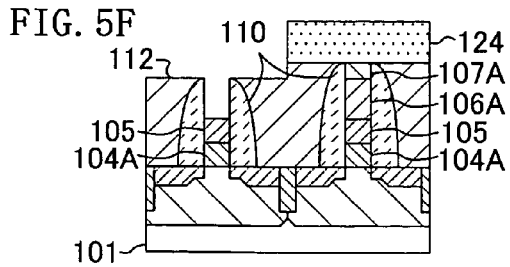

INSULATING BUFFER FILM AND HIGH DIELECTRIC CONSTANT SEMICONDUCTOR DEVICE AND METHOD FOR FABRICATING THE SAME

CROSS-REFERENCE TO RELATED APPLICATION

The disclosure of Japanese Patent Application No. 2005-170208 filed on Jun. 9, 2005 including specification, drawings and claims is incorporated herein by reference in its entirety.

BACKGROUND OF THE INVENTION

The present invention relates to methods for fabricating semiconductor devices, and particularly relates to a semiconductor device including a gate insulating film made of a dielectric material having a high dielectric constant (hereinafter, referred to as a high-κ material) and a method for fabricating the device.

With recent increase in the integration degree and speed of semiconductor integrated circuit devices and expansion of the functionality thereof, the size of metal-oxide-semiconductor field effect transistors (MOSFETs) has been reduced. As the thickness of a gate insulating film decreases in accordance with this size reduction, the problem of increased gate leakage current caused by tunnel current comes to the surface. To solve this problem, there has been developed a technique with which a high-κ material of metal oxide such as hafnium oxide ($HfO_2$) or zirconium oxide ($ZrO_2$) is used for a gate insulating film so that the equivalent oxide thickness EOT is reduced with a physical thickness increased. The equivalent oxide thickness EOT is herein a thickness calculated from the thickness of a film made of a dielectric having a relative dielectric constant different from that of silicon oxide ($SiO_2$) in terms of the relative dielectric constant of silicon oxide.

In the initial stage of development, the use of a gate insulating film made of metal oxide such as $HfO_2$ or $ZrO_2$ causes a problem in which an interface layer is formed between a silicon substrate and the gate insulating film. This interface layer has a low dielectric constant, so that the effective relative dielectric constant of the gate insulating film decreases, i.e., the equivalent oxide thickness EOT increases. Therefore, it was necessary to suppress formation of such an interface layer as much as possible. However, once the formation of an interface layer was successfully suppressed so that a high effective relative dielectric constant of the gate insulating film is maintained, i.e., the equivalent oxide thickness EOT is reduced afterward, there arises another problem in which carrier mobility deteriorates as compared to the case of a silicon oxide film and, consequently, desired operating current cannot be obtained. It has been considered that a cause of this problem is that (1) fixed charge included in a high-κ material electrically interferes with carriers in channel to cause the carrier mobility to deteriorate or (2) carriers in channel are scattered by a lattice in the high-κ material to cause the carrier mobility to deteriorate, for example. In Non-patent literature 1 (M. Hiratani, S. Saito, Y. Shimamoto, and K. Torii, "Effective Electron Mobility Reduced by Remote Charge Scattering in High-κ Gate Stacks", Jpn. J. Appl. Phys., Part 1 84, (2002), pp. 4512-4522), for example, a relationship between the mobility and the thickness of a silicon oxide film formed at the interface between a silicon substrate and a gate insulating film. According to this relationship, to avoid deterioration of the carrier mobility, channel (a substrate) and a high-κ material (a gate insulating film) are preferably separated from each other or a silicate structure in which a metal concentration in the entire high-κ material is reduced is preferably used. However, since the interface layer made of, for example, a silicon oxide film has a low relative dielectric constant, the effective relative dielectric constant of the gate insulating film extremely decreases, i.e., the equivalent oxide thickness EOT increases, in a case where the thickness of the interface layer is relatively large or in the case of a silicate structure in which the metal concentration is relatively low. Accordingly, each of a structure including an interface layer and a structure having a reduced metal concentration has a trade-off relationship with the case of not adopting these structures.

In addition, the use of a high-κ material for a gate insulating film causes another problem. That is, the absolute value of the threshold voltage $V_t$ during transistor operation increases due to reaction at the upper interface of the gate insulating film, i.e., reaction between materials for the gate electrode and the gate insulating film. Though a cause of this problem is unclear, it is reported that exposure to a high-temperature process in a transistor process such as activation performed on ions implanted in source/drain regions causes a gate-electrode material and an gate-insulating-film material to react with each other, so that an effective work function of the gate-electrode material varies. This phenomenon is called Fermi-level pinning. For example, in Non-patent literature 2 (C. Hobbs, L. Fonseca, V. Dhandapani, S. Samavedam, B. Taylor, J. Grant, L. Dip, D. Triyoso, R. Hegde, D. Gilmer, R. Garcia, D. Roan, L. Lovejoy, R. Rai, L. Hebert, H. Tseng, B. White, and P. Tobin, "Fermi level pinning at the polySi/metal oxide interface", Proceedings of the 2003 Symposium on VLSI Technology, (2003), pp. 9-10), it is reported that in a case where a gate-electrode material is polysilicon, the effective work function of the material is fixed at a position near the midgap (i.e., the intermediate value of band gap energy) of silicon and toward the conduction band, i.e., near the work function of n-type doped polysilicon, irrespective of the type of the dopant for polysilicon and, as a result, the absolute value of the threshold voltage $V_t$ of a pMOSFET using a p-type doped polysilicon electrode is considerably large. In addition, regarding this Fermi-level pinning, inversion capacitance of the pMOSFET greatly decreases, which becomes a major obstacle to the use of a high-κ material for a gate insulating film and polysilicon for a gate electrode.

As a means for avoiding Fermi-level pinning occurring when polysilicon is used for a gate electrode, a metal-gate transistor structure using a metal having an appropriate work function and a so-called full-silicidation (FUSI) gate transistor structure in which not only an upper portion but also the entire portion of a polysilicon gate electrode is silicided has been proposed. However, for the metal-gate transistor structure, even when a metal having a high melting point is used as a gate-electrode material, a high-temperature process such as activation on source/drain regions is performed, so that Fermi-level pinning occurs and a desired work function is not obtained. In a case where a semiconductor device has a complementary MOS structure (i.e., a CMOS structure) including a pMOSFET and an nMOSFET, a dual-metal structure including metals having work functions appropriate for the respective pMOSFET and nMOSFET is needed. However, this structure has the problem of uneasiness of processes such as gate etching.

For the FUSI gate transistor structure, a high-temperature process such as activation on source/drain regions is performed and then a polysilicon gate electrode is subjected to full-silicidation. In other words, polysilicon forming the gate electrode is replaced with metal silicide. In this case, when a CMOS structure is adopted, metal suicides having work functions appropriate for a pMOSFET and an nMOSFET are needed for the respective gate electrodes. In Non-patent literature 3 (K. Takahashi, K. Manabe, T. Ikarashi, N. Ikarashi, T. Hase, T. Yoshihara, H. Watanabe, T. Tatsumi and Y. Mochizuki, "Dual Workfunction Ni-Silicide/HfSiON Gate Stacks by Phase-Controlled Full-Silicidation (PC-FUSI) Technique for 45 nm-node LSTP and LOP Devices", IEDM Tech. Dig., (2004), pp. 91-94), the possibility of controlling the work function by varying the proportions of metal nickel and silicon in metal silicide is proposed. However, Fermi-level pinning still occurs in this case, and a desired work function is not obtained. Moreover, no specific process flows for implementing a CMOS structure are clarified. In Non-patent literature 4 (C. S. Park, B. J. Cho, L. J. Tang, and D. L. Kwong, "Substituted Aluminum Metal Gate on High-κ Dielectric for Low Work-Function and Fermi-Level Pinning Free", IEDM Tech. Dig., (2004), pp. 299-302), insufficient uniformity and poor yield of a FUSI gate process itself are reported.

SUMMARY OF THE INVENTION

It is therefore an object of the present invention to obtain a desired work function by suppressing reaction between a high-κ material and a gate-electrode material that causes Fermi-level pinning so that uniformity and yield are enhanced in a semiconductor device with a CMOS structure, i.e., a dual-gate structure, that is a MOS transistor structure using a fully-silicided gate or a metal gate, and particularly a CMOS semiconductor device using a high-κ material for a gate insulating film.

To achieve the object, according to the present invention, in full silicidation of gate electrode made of silicon in a semiconductor device having a CMOS transistor, the level difference between the work function of the metal and the Fermi level of silicon is utilized in such a manner that when the work function of the metal is higher than the Fermi level of silicon, the metal concentration in the gate electrode of a pMOSFET is set higher than that of an nMOSFET whereas when the work function of the metal is lower than the Fermi level of silicon, the metal concentration in the gate electrode of the pMOSFET is set lower than that of the nMOSFET. A metal having a work function higher than the Fermi level of silicon is used for at least the gate electrode of the pMOSFET, out of the pMOSFET and the nMOSFET.

Specifically, a first semiconductor device according to the present invention includes: an n-transistor including a first gate insulating film made of a high-dielectric-constant material and a first gate electrode fully silicided with a metal, the first gate insulating film and the first gate electrode being formed in this order over a semiconductor region; and a p-transistor including a second gate insulating film made of the high-dielectric-constant material and a second gate electrode fully silicided with the metal, the second gate insulating film and the second gate electrode being formed in this order over the semiconductor region, wherein if the metal has a work function larger than a Fermi level in potential energy of electrons of silicon, a metal concentration of the second gate electrode is higher than that of the first gate electrode whereas if the metal has a work function smaller than the Fermi level of silicon, a metal concentration of the second gate electrode is lower than that of the first gate electrode.

In the first semiconductor device, when the work function of a metal is higher than the Fermi level in potential energy of electrons of silicon is set higher than the metal concentration in the fully-silicided first gate electrode, so that the metal having a Fermi level higher than that of silicon forming the second gate electrode enables suppression of Fermi-level pinning occurring in the p-transistor.

In the first semiconductor device, the Fermi level is 4.6 eV.

In the first semiconductor device, the metal preferably contains nickel or platinum as a main component. Since nickel (Ni) and platinum (Pt) have work function higher than the Fermi-level of silicon, so that these elements are preferable especially for the p-transistor of the present invention.

A second semiconductor device according to the present invention includes: an n-transistor including a first gate insulating film made of a high-dielectric-constant material and a first gate electrode, the first gate insulating film and the first gate electrode being formed in this order over a semiconductor region; and a p-transistor including a second gate insulating film made of the high-dielectric-constant material and a second gate electrode made of a conductive film containing a first metal, the second gate insulating film and the second gate electrode being formed in this order over the semiconductor region, wherein the first metal has a work function larger than a Fermi level in potential energy of electrons of silicon.

In the second semiconductor device, the work function of the first metal forming the second gate electrode in the p-transistor is higher than the Fermi level in potential energy of electrons of silicon, so that Fermi-level pinning occurring in the p-transistor is suppressed.

In the second semiconductor device, the first gate electrode is preferably fully silicided with a second metal.

In the second semiconductor device, the first gate electrode is preferably made of a conductive film containing a second metal.

In the second semiconductor device, the first metal preferably contains nickel or platinum as a main component.

In the first or second semiconductor device, the high-dielectric-constant material preferably contains at least one metal selected from the group consisting of silicon, germanium, hafnium, zirconium, titanium, tantalum, aluminum and a rare-earth metal.

In the first or second semiconductor device, a buffer film made of an insulator is preferably formed between the first gate insulating film and the first gate electrode and between the second gate insulating film and the second gate electrode.

In this case, the buffer film is preferably made of silicon nitride, silicon oxide, titanium oxide or aluminum oxide.

A first method for fabricating a semiconductor device according to the present invention includes the steps of: forming an n-transistor including a first gate insulating film and a first gate electrode made of silicon and a p-transistor including a second gate insulating film and a second gate electrode made of silicon, on a semiconductor region; selectively forming a first metal film and a second metal film on the first gate electrode and the second gate electrode, respectively, such that the first metal film and the second metal film have different areas; and performing a heat treatment on the first gate electrode and the second gate electrode on which the first metal film and the second metal film have been formed, thereby fully siliciding each of the first gate electrode and the second gate electrode, wherein in the step of selectively forming the first and second metal films, if a metal constituting the second metal film has a work function larger than a Fermi level in potential energy of electrons of silicon, the second metal film is formed to have an area larger than that of the first metal film whereas if the metal constituting the second metal film has a work function smaller than the Fermi level of silicon, the second metal film is formed to have an area smaller than that of the first metal film.

With the first method, in the step of selectively forming a metal film for full silicidation, when the work function of the metal constituting the second metal film provided on the p-transistor is higher than the Fermi-level in potential energy of electrons of silicon, for example, the metal concentration in the second gate electrode is higher than that of the first gate electrode in the step of siliciding the entire portions of the first and second gate electrodes. This is because the area of the second metal film is made larger than that of the first metal film. Accordingly, the use of the metal having a Fermi level higher than that of silicon and a high metal concentration enables suppression of Fermi-level pinning occurring in the p-transistor including the second gate electrode. In addition, the gate electrodes are silicided after patterning, pattern etching that has been conventionally performed on gate films is unnecessary.

A second method for fabricating a semiconductor device according to the present invention includes the steps of: forming an n-transistor including a first gate insulating film and a first gate electrode made of silicon and a p-transistor including a second gate insulating film and a second gate electrode made of silicon, on a semiconductor region; forming a metal film on the first gate electrode and the second gate electrode; and performing a heat treatment on the first gate electrode and the second gate electrode on which the metal film has been formed, thereby fully siliciding each of the first gate electrode and the second gate electrode, wherein in the step of forming the metal film, if a metal constituting the metal film has a work function larger than a Fermi level in potential energy of electrons of silicon, the thickness of a portion of the metal film located on the second gate electrode is made larger than that on the first gate electrode whereas if the metal has a work function smaller than the Fermi level of silicon, the thickness of the portion of the metal film located on the second gate electrode is made smaller than that on the first gate electrode.

With the second method, in the step of selectively forming a metal film for full silicidation, when the work function of the metal forming the metal film is higher than the Fermi-level in potential energy of electrons of silicon, for example, the metal concentration in the second gate electrode is higher than that of the first gate electrode in the step of siliciding the entire portions of the first and second gate electrodes. This is because the thickness of a portion of the metal film located on the second gate electrode is made larger than that on the first gate electrode. Accordingly, the use of the metal having a Fermi level higher than that of silicon and a high metal concentration enables suppression of Fermi-level pinning occurring in the p-transistor including the second gate electrode. In addition, the gate electrodes are silicided after patterning, pattern etching that has been conventionally performed on gate films is unnecessary.

In the second method, the step of forming the metal film preferably includes the step of selectively removing an upper part of a portion of the metal film located on one of the first and second gate electrodes so that the thickness of the portion of the metal film is reduced.

A third method for fabricating a semiconductor device according to the present invention includes the steps of: forming an n-transistor including a first gate insulating film and a first gate electrode made of silicon and a p-transistor including a second gate insulating film and a second gate electrode made of silicon, on a semiconductor region; masking the first gate electrode and then forming a first metal film on the second gate electrode; performing a heat treatment on the second gate electrode on which the first metal film has been formed, thereby fully siliciding the second gate electrode; removing the mask and then forming a second metal film on the first gate electrode; and performing a heat treatment on the first gate electrode on which the second metal film has been formed, thereby fully siliciding the first gate electrode, wherein in the step of siliciding the second gate electrode, if a metal constituting the first metal film has a work function larger than a Fermi level in potential energy of electrons of silicon, a metal concentration of silicide in the silicided second gate electrode is set higher than 50% whereas if the metal constituting the first metal film has a work function smaller than the Fermi level of silicon, the metal concentration of silicide in the second gate electrode is set lower than 50%.

With the third method, in the step of siliciding the second gate electrode, when the work function of the metal forming the first metal film provided on the p-transistor is higher than the Fermi-level in potential energy of electrons of silicon, for example, the metal concentration in silicide in the silicided second gate electrode forming the p-transistor is higher than 50%. Accordingly, the metal having a Fermi level higher than that of silicon and having a high metal concentration enables suppression of Fermi-level pinning occurring in the p-transistor including the second gate electrode. In addition, the gate electrodes are silicided after patterning, pattern etching that has been conventionally performed on gate films is unnecessary.

A fourth method for fabricating a semiconductor device according to the present invention includes the steps of: forming an n-transistor including a first gate insulating film and a first gate electrode made of silicon and a p-transistor including a second gate insulating film and a second gate electrode made of silicon, on a semiconductor region; selectively removing the gate electrode of one of the n-transistor and the p-transistor; selectively forming a third gate electrode made of a conductive film containing a first metal for the transistor from which the gate electrode has been removed; forming a metal film made of a second metal on the gate electrode of the other transistor; and performing a thermal treatment on the gate electrode on which the metal film has been formed, thereby fully siliciding the gate electrode on which the metal film has been formed.

With the fourth method, the gate electrode of one of the n-transistor and the p-transistor is selectively removed, and then a third gate electrode made of a conductive film containing a first metal is selectively formed for the transistor whose gate electrode has been removed. In this manner, the silicon second gate electrode of the p-transistor is replaced with the third gate film made of the conductive film containing the first metal, so that when the work function of the first metal is higher than the Fermi-level in potential energy of electrons of silicon, the third gate electrode containing the first metal and forming the p-transistor enables suppression of Fermi-level pinning occurring in the p-transistor. In addition, the gate electrodes are silicided after patterning, pattern etching that has been conventionally performed on gate films is unnecessary.

A fifth method for fabricating a semiconductor device according to the present invention includes the steps of: forming an n-transistor including a first gate insulating film and a first gate electrode made of silicon and a p-transistor including a second gate insulating film and a second gate electrode made of silicon, on a semiconductor region; selectively removing the second gate electrode of the p-transistor; selectively forming a third gate electrode made of a first conductive film containing a first metal for the p-transistor from which the second gate electrode has been removed; selectively removing the first gate electrode of the n-transistor; and selectively forming a fourth gate electrode made of a second conductive film containing a second metal for the n-transistor from which the first gate electrode has been removed.

With the fifth method, the second gate electrode of the p-transistor is selectively removed, and then a third gate electrode made of a first conductive film containing a first metal is selectively formed for the p-transistor from which the second gate electrode has been removed. In addition, the first gate electrode of the n-transistor is selectively removed, and then a fourth gate electrode made of a second conductive film containing a second metal is selectively formed in the n-transistor from which the first gate electrode has been removed. In this manner, in the p-transistor including the third gate electrode made of the first conductive film and the n-transistor including the fourth gate electrode made of the second conductive film, the work functions of the first and second metals are optimized. For example, the work function of the first metal is set higher than the Fermi level of silicon and the work function of the second metal is set lower than the Fermi level of silicon, so that Fermi-level pinning occurring in the p-transistor and the n-transistor is suppressed. In addition, the gate electrodes are metallized after patterning, pattern etching that has been conventionally performed on gate films is unnecessary.

In the first or third method, each of the first and second metal films preferably contains nickel or platinum as a main component.

In the second method, the metal film preferably contains nickel or platinum as a main component.

In the fourth or fifth method, the first metal or the second metal preferably contains nickel or platinum as a main component.

In the first method, the thickness ratio of the first metal film with respect to the first gate electrode is preferably one or less, and the thickness ratio of the second metal film with respect to the second gate electrode is preferably two or more.

In the second method, the thickness ratio of the portion of the metal film located on the first gate electrode with respect to the first gate electrode is preferably one or less, and the thickness ratio of the portion of the metal film located on the second gate electrode with respect to the second gate electrode is preferably two or more.

In the fifth method, out of the n-transistor and the p-transistor, the thickness ratio of the metal film with respect to the gate electrode on which the metal film has been formed is preferably one or less.

In the first or second method, the silicide in the first gate electrode preferably has a silicon concentration higher than that in the second gate electrode. In the first through fifth methods, each of the first and second gate insulating films is preferably made of a high-dielectric-constant material.

In this case, the high-dielectric-constant material preferably contains at least one metal selected from the group consisting of silicon, germanium, hafnium, zirconium, titanium, tantalum, aluminum and a rare-earth metal. If each of the first and second gate insulating films is made of a high-dielectric-constant material, in the step of forming the n-transistor and the p-transistor, a buffer film made of an insulator is preferably formed between the first gate insulating film and the first gate electrode and between the second gate insulating film and the second gate electrode. Then, the buffer film provided between the silicon gate insulating film and the gate electrode enables suppression of reaction between the gate insulating film and the gate electrode during a high-temperature process in the formation of source/drain regions, for example. In addition, damage on the gate insulating film of a high-κ material during removal of silicon (polysilicon) gate electrode and full silicidation is suppressed.

In this case, the buffer film is preferably made of silicon nitride, silicon oxide, titanium oxide or aluminum oxide.

In forming the buffer film, the step of forming the n-transistor and the p-transistor preferably includes, before formation of the buffer film, the step of performing a heat treatment on the first gate insulating film made of the high-dielectric-constant material and the second gate insulating film made of the high-dielectric-constant material.

With semiconductor devices and methods for fabricating the devices according to the present invention, a dual-gate structure in which full-silicidation or metallization with metals having work functions suitable for respective p- and n-transistors is performed is achieved for a CMOS device using a high-κ material for a gate insulating film. As a result, driving performances of transistors are enhanced.

BRIEF DESCRIPTION OF THE DRAWINGS

FIGS. 1A through 1H are cross-sectional views illustrating respective process steps of a method for fabricating a semiconductor device according to a first embodiment of the present invention in the fabrication order.

FIGS. 2A through 2J are cross-sectional views illustrating respective process steps of a method for fabricating a semiconductor device according to a second embodiment of the present invention in the fabrication order.

FIGS. 3A through 3K are cross-sectional views illustrating respective process steps of a method for fabricating a semiconductor device according to a third embodiment of the present invention in the fabrication order.

FIGS. 4A through 4L are cross-sectional views illustrating respective process steps of a method for fabricating a semiconductor device according to a fourth embodiment of the present invention in the fabrication order.

FIGS. 5A through 5K are cross-sectional views illustrating respective process steps of a method for fabricating a semiconductor device according to a fifth embodiment of the present invention in the fabrication order.

FIG. 11A is a graph for MOSFETs according to a comparative example. FIG. 11B is a graph for MOSFETs according to the first embodiment.

DETAILED DESCRIPTION OF THE INVENTION

Comparative Example

As a comparative example for embodiments of the present invention, a method for fabricating a conventional MOSFET having a fully-silicided gate electrode in which the entire portions of a gate insulating film made of a high-κ material and polysilicon are silicided will be described with reference to FIGS. 6A through 6F.

Figure 6A:
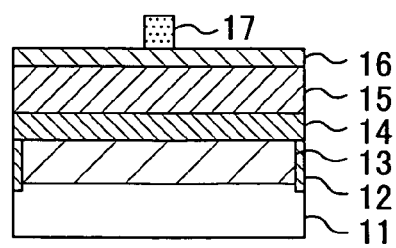
FIGS. 6A through 6F are cross-sectional views illustrating respective process steps of a method for fabricating a conventional MOSFET including a fully-silicided gate electrode.

First, as shown in FIG. 6A, an isolation film 12 serving as a shallow trench isolation (STI) is selectively formed in an upper portion of a substrate 11 made of silicon (Si) and having a principal surface whose plane orientation is the (100) plane, for example. Subsequently, ions are implanted in an upper portion of the substrate 11, thereby forming a p-well 13 for an nMOSFET and an n-well 13 for a pMOSFET. In this manner, a plurality of device regions are formed in the principal surface of the substrate 11. Thereafter, the surface of the substrate 11 is subjected to known standard RCA cleaning and dilute hydrofluoric acid (HF) cleaning in this order. Then, heat treatment is performed on the substrate 11 at a temperature of about 600° C. to about 700° C. in an oxygen atmosphere, for example. In this manner, an underlying film (not shown) made of silicon oxide ($SiO_2$) and having a thickness of about 0.5 nm is formed on the device regions in the substrate 11.

Next, a high-κ film 14 made of metal oxide such as hafnium silicate ($Hf_xSi_{1-x}O_4$) is deposited by, for example, a metal-organic chemical vapor deposition (MOCVD) process to a thickness of about 3 nm over the underlying film.

Thereafter, heat treatment is performed at a temperature of about 700° C. to about 1000° C. so as to make the high-κ film sustainable in a compensation step for deficiency caused by removal of a remaining impurity such as carbon (C) or hydrogen (H) and nitriding and also sustainable under a thermal budget in a subsequent high-temperature process. The heating atmosphere at this time is preferably a nitrogen ($N_2$) atmosphere containing a trace amount of oxygen ($O_2$) or an ammonium ($NH_3$) atmosphere so as to prevent a large change in thickness of the underlying film (the interface layer) between the substrate 11 and the high-κ film 14.

Then, a gate-electrode film 15 having a thickness of about 100 nm and made of doped polysilicon and a hard-mask film 16 made of silicon oxide are deposited in this order over the high-κ film 14 by CVD processes. Subsequently, a resist mask 17 having a gate pattern is formed on the hard-mask film 16 by lithography.

Figure 6B:
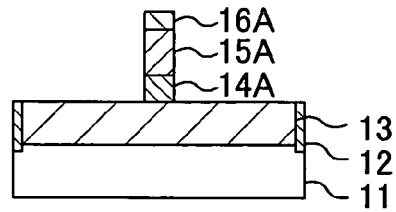

Thereafter, as shown in FIG. 6B, the hard-mask film 16 through the high-κ film 14 are patterned in this order by dry etching using the resist mask 17. In this manner, a hard mask 16A is formed out of the hard-mask film 16, a gate electrode 15A is formed out of the gate-electrode film 15 and a gate insulating film 14A is formed out of the high-κ film 14.

Figure 6C:
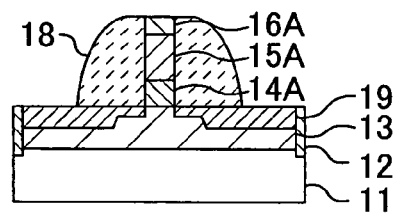

Subsequently, as shown in FIG. 6C, ion implantation (extension implantation) is performed on an upper portion of the substrate 11 using the hard mask 16A. Then, side walls 18 made of silicon oxide are formed on both sides of the gate electrode 15A, and then ions are implanted again in an upper portion of the substrate 11 using the side walls 18 and the gate electrode 15A as a mask, thereby forming source/drain regions 19.

Figure 6D:
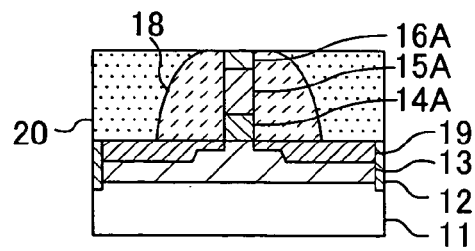

Then, as shown in FIG. 6D, an interlayer insulating film 20 made of silicon oxide is deposited by a plasma CVD process over the entire surface of the substrate 11 including the hard mask 16A and the side walls 18. Subsequently, the upper face of the interlayer insulating film 20 is planarized by, for example, a chemical mechanical polishing (CMP) process, thereby exposing the hard mask 16A.

Figure 6E:
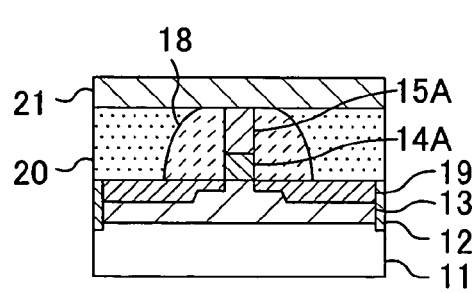
Figure 6F:
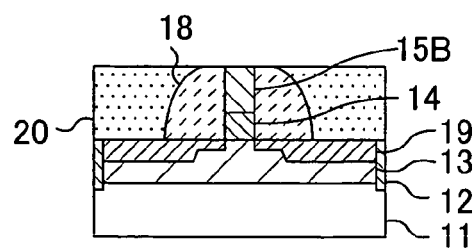

Thereafter, as shown in FIG. 6E, the hard mask 16A, an upper portion of the interlayer insulating film 20 and upper portions of the side walls 18 are etched back, thereby exposing the gate electrode 15A. Subsequently, a metal film 21 made of nickel (Ni) for silicidation of the gate electrode 15A is deposited over the interlayer insulating film 20 from which the gate electrode 15A is exposed. Then, the whole gate electrode 15A is silicided (full-silicidation) by known heat treatment to be changed into a gate electrode 15B. Thereafter, the unreacted metal film 21 is removed by selective dry etching, for example, thereby obtaining a MOSFET including the fully-silicided gate electrode 15B as shown in FIG. 6F.

Figure 7:
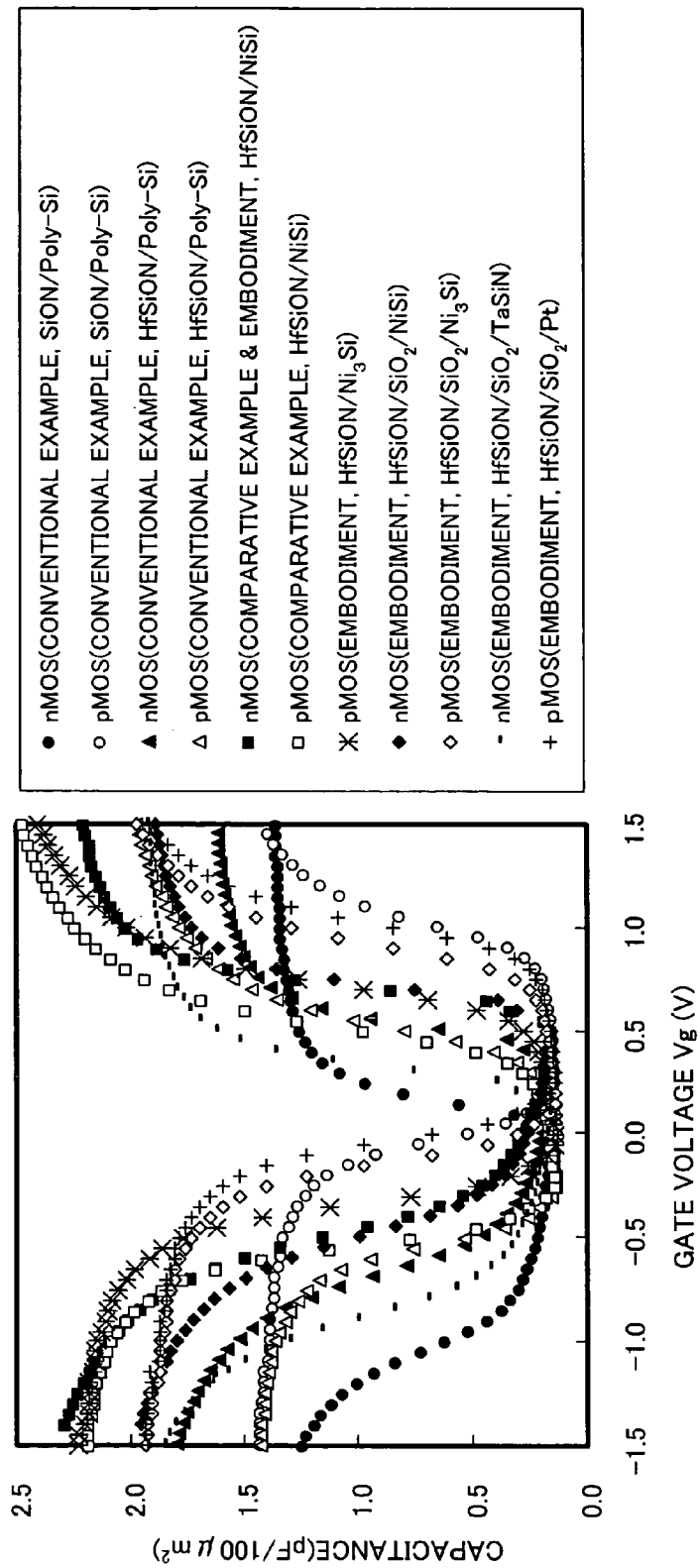
FIG. 7 is a graph showing capacitor (CV) characteristics of semiconductor devices (MOSFETs) fabricated according to the first through fifth embodiments and comparative examples.

FIG. 7 shows a capacitance-voltage (CV) characteristic of the gate insulating film 14A formed in this comparative example. In FIG. 7, the MOSFETs of this comparative example (■ and □) including the gate insulating films 14A made of hafnium silicate (HfSiON) and the gate electrodes 15B made of nickel silicide (NiSi) is shown together with a conventional example (● and ○) including gate insulating films made of SiON and gate electrodes made of polysilicon (Poly-Si) and a conventional example (▲ and Δ) including gate insulating films made of HfSiON and gate electrodes made of polysilicon (Poly-Si). In this graph, the ordinate represents the capacitance (pF/100 μm$^2$) and the abscissa represents the gate voltage $V_g$ (V). Each of the gate insulating films contains nitrogen typified by SiON and HfSiON, as a result of nitriding.

In FIG. 7, with respect to the CV curve of the nMOSFET (represented by ●) including the SiON gate insulating film and the Poly-Si gate electrode, the flat band voltage $V_{fb}$ rises at about −1V at the accumulation side (where the gate voltage $V_g$<0) and the threshold voltage $V_t$ rises at about +0.2 V at the inversion side (where the gate voltage $V_g$>0). With respect to the CV curve of the pMOSFET (represented by ○) including the SiON gate insulating film and the Poly-Si gate electrode, the flat band voltage $V_{fb}$ rises at about +0.8V at the accumulation side (where the gate voltage $V_g$>0) and the threshold voltage $V_t$ rises at about −0.2 V at the inversion side (where the gate voltage $V_g$<0). In this case, the difference between the flat band voltage $V_{fb}$ and the threshold voltage $V_t$ is associated with 1.1 eV that is the band gap energy of silicon (Si).

Figure 8:
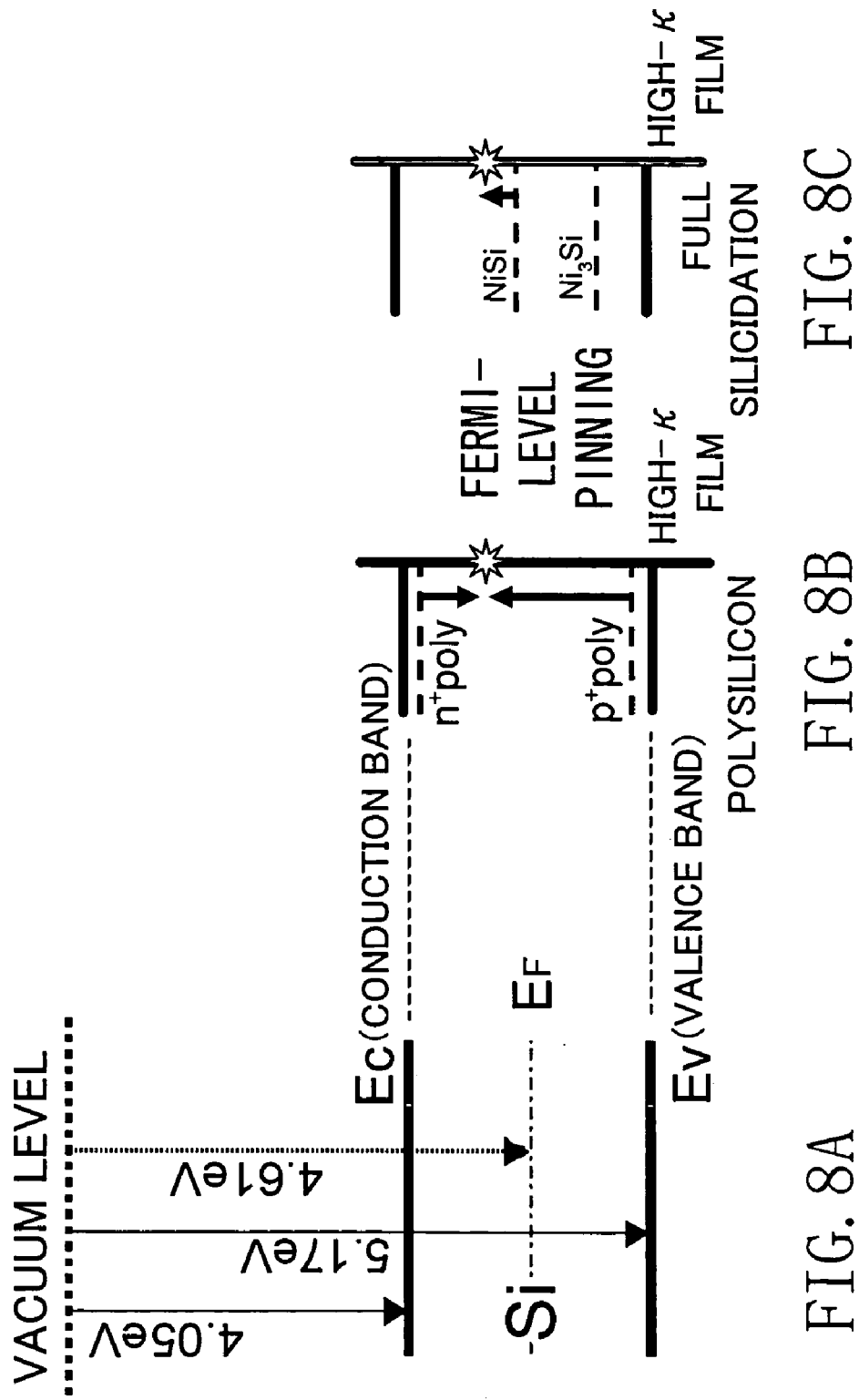
FIG. 8A is a band diagram of silicon in a comparative example.
FIG. 8B is a band diagram showing Fermi-level pinning occurring in polysilicon (a gate electrode) when a high-κ material is used for a gate insulating film.
FIG. 8C is a band diagram showing the Fermi level in a semiconductor device (MOSFET) including a silicided gate electrode with a varying metal concentration according to the first through third embodiments.

The threshold voltage $V_t$ corresponds to the threshold voltage $V_t$ during transistor operation. Therefore, the absolute value of the threshold voltage $V_t$ is preferably as small as possible. Accordingly, the absolute value of the flat band voltage $V_{fb}$ is preferably as close to about 1 V as possible. This preferred state means that the work functions of the gate electrodes of the nMOSFET and pMOSFET, or n$^+$ polysilicon and p$^+$ polysilicon, are close to the conduction band (4.05 eV) and the valence band (5.17 eV) of silicon (Si), respectively, as shown in FIG. 8B. That is, the preferred state is n$^+$ semiconductor and p$^+$ semiconductor each having a shallow energy level apart from the midgap (i.e., the intermediate energy between the valence band $E_v$ and the conduction band $E_c$) of each of n$^+$ polysilicon and p$^+$ polysilicon.

However, as seen from FIG. 7, in the conventional example (represented by ▲ and Δ) including HfSiON gate insulating films and Poly-Si gate electrodes, the absolute values of the flat band voltages $V_{fb}$ in both the nMOSFET and pMOSFET, especially the pMOSFET, are small, so that the absolute values of the threshold voltages $V_t$ are large accordingly. This means that the effective work functions of n$^+$ polysilicon and p$^+$ polysilicon forming the gate electrodes of the nMOSFET and pMOSFET represented by ▲ and Δ are close to the midgap of silicon as indicated by the vertical arrows in FIG.

8B and, more strictly, are pinned slightly toward the conduction band $E_c$. There are various theories on this phenomenon, but it is basically considered that the phenomenon occurs because of reaction between a gate-electrode material and metal oxide of a high-κ material caused by a thermal budget in a transistor process, which is Si—HfO$_2$ bonding in this case. This phenomenon is called Fermi-level pinning as described above.

On the other hand, in the nMOSFET and pMOSFET of this comparative example (represented by ■ and □) including the gate insulating films 14A of HfSiON and the gate electrodes 15B of NiSi, as shown in FIG. 8C, nickel silicide (NiSi) has a work function close to the midgap of silicon. Accordingly, as seen from FIG. 7, the absolute values of the flat band voltages $V_{fb}$ in both the nMOSFET and the pMOSFET, especially the pMOSFET, are small, so that the absolute values of the threshold voltages $V_t$ increase accordingly.

As described above, though polysilicon and nickel silicide as components of a gate electrode inherently have different work functions, Fermi-level pinning still occurs. In addition, in consideration of conformity with a CMOS process, gate electrodes of an nMOSFET and a pMOSFET need to be made of electrode materials having respective different work functions, i.e., it is necessary to achieve a dual-gate structure.

As seen from FIG. 7, in this comparative example (■ and □), the capacitances are larger than those in the conventional example (● and ○) using polysilicon electrodes and are twice as large as those in the conventional example at the inversion side. Accordingly, because of reduction of the equivalent oxide thickness EOT and increase of the inversion capacitance, enhancement of transistor (FET) drivability is expected. It is considered that this is because the fully-silicided gate electrode 15B made of NiSi substantially functions as a metal gate so that depletion capacitance of the polysilicon electrode is eliminated.

Figure 9:
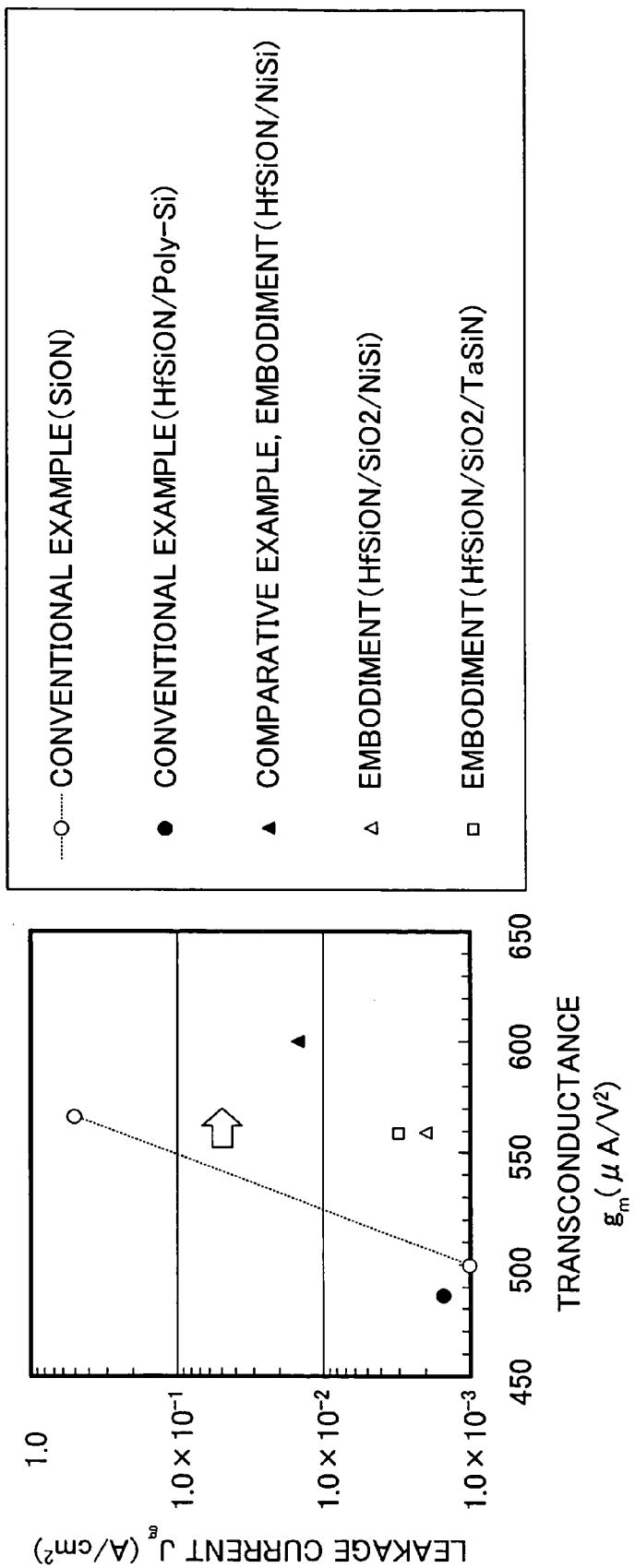
FIG. 9 is a graph showing a relationship between leakage current and transconductance of MOSFETs fabricated according to the first through fifth embodiments and comparative examples.

FIG. 9 shows a relationship between leakage current $J_g$ and transconductance $g_m$ of the nMOSFET fabricated in this comparative example. In this case, all the samples shown in FIG. 9 are measured. The ordinate represents leakage current $J_g$ (A/cm$^2$) and the abscissa represents transconductance $g_m$ (μA/V$^2$). The transconductance $g_m$ is an index of drivability during transistor operation, i.e., the differential value of ON current with respect to a gate voltage. The transconductance $g_m$ is approximately inversely proportional to the equivalent oxide thickness EOT and proportional to carrier mobility. As shown in FIG. 9, in the MOSFET (●) including the HfSiON gate insulating film and the Poly-Si gate electrode, high-speed response with low power consumption, i.e., small leakage current $J_g$ and high transconductance $g_m$, is expected, as compared to the MOSFET (○) including an SiON film as the gate insulating film.

However, in the conventional example (represented by ●) using a combination of the Poly-Si gate electrode and the HfSiON gate insulating film, the transconductance $g_m$ is lower than that in a conventional structure using SiON for a gate insulating film with respect to the same leakage current. This is mainly because of deterioration of carrier mobility. On the other hand, in this comparative example (represented by ▲) using a combination of the NiSi gate electrode and the HfSiON gate insulating film, the leakage current $j_g$ increases to some degree because of thickness reduction of the gate insulating film, but the transconductance $g_m$ greatly increases because of large increase of inversion capacitance shown in FIG. 7. Accordingly, at this point, drivability of the transistor is greatly enhanced by introducing the fully-silicided gate electrode 15B. In FIG. 9, a region at the right side of the conventional example (SiON) indicated by the arrow is a region where the transconductance $g_m$ is higher than that in the case of using SiO$_2$ (SiON) for a gate insulating film with respect to the same leakage current.

Figure 10:
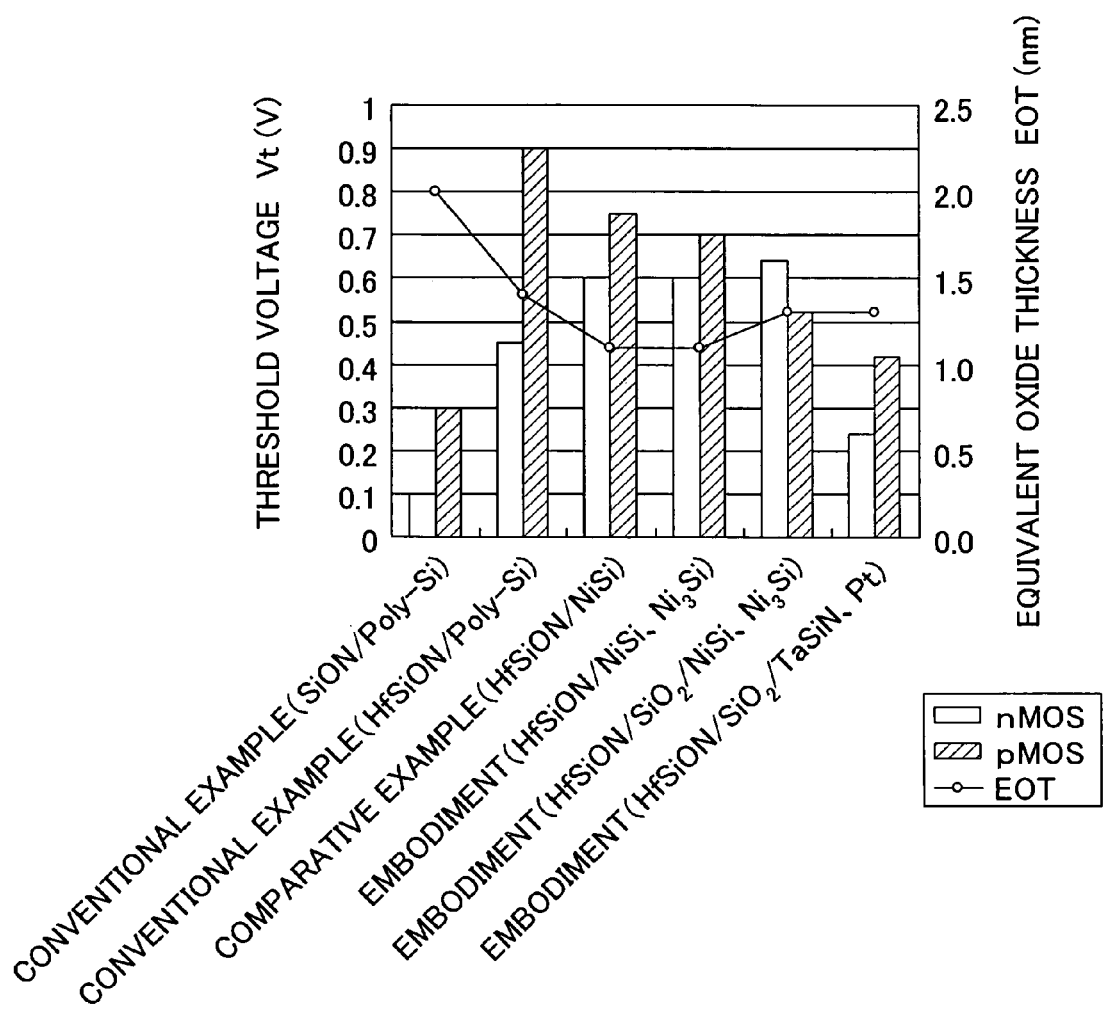
FIG. 10 is a graph showing measurement results on equivalent oxide thicknesses and threshold voltages of MOSFET using gate insulating films fabricated according to the first through fifth embodiments and comparative examples.

FIG. 10 shows measurement results on the equivalent oxide thicknesses EOT and the absolute values of the threshold voltages $V_t$ of the MOSFETs fabricated in the comparative example and the conventional examples for all the samples shown in FIG. 7. FIG. 10 shows that the equivalent oxide thickness EOT is reduced when HfSiON, which is a high-κ material, is used for a gate insulating film, as compared to the conventional structures using SiON for gate insulating films. However, the absolute values of the threshold voltages $V_t$ of the nMOSFET and the pMOSFET using HfSiON gate insulating films for polysilicon electrodes are larger than those of the conventional structures using SiON gate insulating films for polysilicon electrodes, because of Fermi-level pinning. Between these MOSFETs, the absolute value of the threshold voltage $V_t$ of the pMOSFET is especially large. In the nMOSFET and the pMOSFET of this comparative example using HfSiON gate insulating films for the fully-silicided gate electrodes 15B, the absolute values of the threshold voltages $V_t$ are larger than those in the conventional example using SiON for gate insulating films and Poly-Si for gate electrodes, and the absolute value of the threshold value $V_t$ of the pMOSFET is especially large. This is because nickel silicide inherently having a work function closer to the midgap of silicon is used for the gate electrodes in this conventional example.

In a MOSFET, a large absolute value of the threshold voltage $V_t$ means that an effective voltage is less likely to be applied by application of a gate voltage $V_g$. Accordingly, the MOSFET using a combination of a gate electrode of polysilicon and a gate insulating film of a high-κ material (HfSiON) has electrical characteristics, including transconductance $g_m$, inferior to those of the conventional MOSFET using SiON for a gate insulating film. In addition, this comparative example using a combination of the fully-silicided gate electrode 15B and the gate insulating film 14A of a high-κ material is excellent in transconductance $g_m$ but is poor in electrical characteristics because the threshold voltage $V_t$ is higher than that of the conventional MOSFET using SiON for a gate insulating film.

Figure 11A:
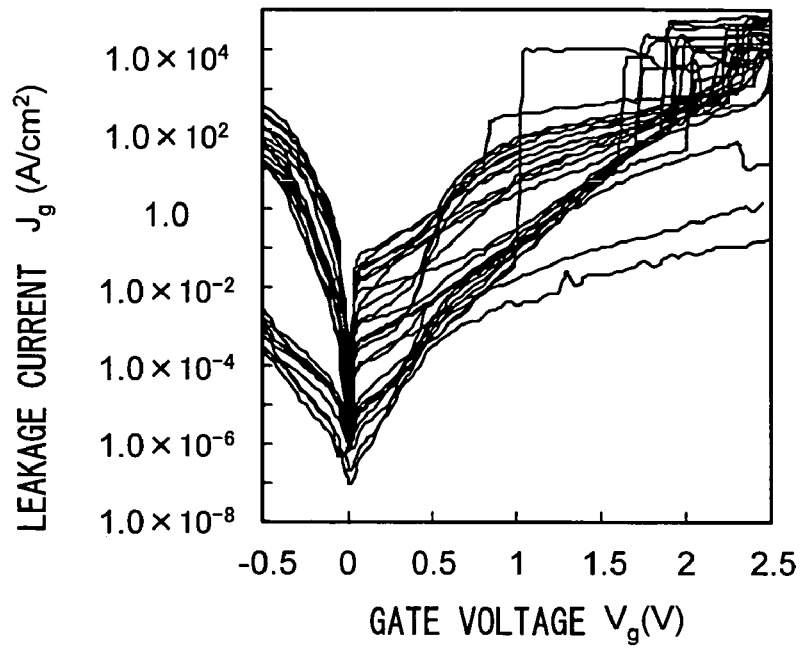
FIGS. 11A and 11B show relationships between the absolute values of leakage current and gate voltages of MOSFETs.

Furthermore, this comparative example using a combination of the fully-silicided gate electrode 15B and the gate insulating film 14A of a high-κ material has another problem of a larger absolute value of leakage current $J_g$ and greater variation thereof as shown in FIG. 11A. This variation is observed to some extent in conventional structures using polysilicon electrodes, but is considered to be more pronounced by full silicidation. In addition, it is also necessary to enhance the durability of a high-κ film to a full silicidation process.

As described above, in the MOSFETs of the comparative example using a combination of the gate insulating films 14A of a high-κ material and the fully-silicided gate electrodes 15B, the gate electrodes 15B function as metal gates in effect and the transistor drivability due to increase of inversion capacitance is enhanced, but the absolute values of the threshold values $V_t$ are large due to the Fermi-level pinning described above.

For the fully-silicided gate electrode 15B, it is supposed to be possible to adjust the work function by changing the composition of silicide. However, in general, it is not easy to control the metal amount contributing silicidation in a MOSFET. This means that a process flow for implementing a dual gate structure needs to be developed for reasons different from those for conventional transistor processes using metal gate structure including metal materials. Originally, with a full silicidation process, it should be easy to avoid difficulty in gate etching involved in conventional techniques and also to avoid high-temperature processes that cause reaction between high-κ materials and gate-electrode materials, which is considered to be a cause of Fermi-level pinning.

Hereinafter, embodiments of the present invention will be described with reference to the drawings. In the following embodiments, fabrication methods for achieving different compositions of gate electrodes of an nMOSFET and a pMOSFET, i.e., for implementing a so-called dual-gate structure, in order to prevent Fermi-level pinning in a CMOS structure using fully-silicided gates or metal gates.

Embodiment 1

A method for fabricating a semiconductor device with a CMOS structure according to a first embodiment of the present invention will be described with reference to FIGS. 1A through 1H.

First, as shown in FIG. 1A, an isolation film 102 serving as a shallow trench isolation (STI) is selectively formed in an upper portion of a substrate 101 made of silicon (Si) having a principal surface whose plane orientation is the (100) plane, for example. Subsequently, ions are implanted in an upper portion of the substrate 101, thereby forming a p-well 103A in an n-transistor region 1 and an n-well 103B in a p-transistor region 2. In this manner, a CMOS device region is formed in the principal surface of the substrate 101. Thereafter, the surface of the substrate 101 is subjected to known standard RCA cleaning and dilute hydrofluoric acid (HF) cleaning in this order. Then, heat treatment is performed on the substrate 101 whose surface has been cleaned, at a temperature of about 600° C. to about 700° C. in an oxygen atmosphere, for example. In this manner, an underlying film (not shown) made of silicon oxide ($SiO_2$) and having a thickness of about 0.5 nm is formed on the CMOS device regions in the substrate 101.

Next, a high-κ film 104 made of metal oxide is deposited by, for example, a metal-organic chemical vapor deposition (MOCVD) process to a thickness of about 3 nm over the underlying film. Specifically, bubbling is performed by blowing a carrier gas containing, for example, nitrogen ($N_2$) into Hf($O$-$t$-$C_3H_7$)$_4$ as a liquid Hf source and Si($O$-$t$-$C_3H_7$)$_4$ as a liquid Si source. In this manner, a source gas in which the liquid Hf source and the liquid Si source are in gaseous form is introduced into a reaction chamber together with the carrier gas. Then, a high-κ film 104 (i.e., a film made of a high-κ dielectric) made of hafnium silicate ($Hf_xSi_{1-x}O_4$) is deposited with the temperature in the chamber set at about 500° C. At this time, the Hf concentration x with respect to Si is appropriately changed by adjusting the supply amounts of the Hf source and the Si source. The Hf concentration x is preferably in the range from about 0.3 to about 0.5.

Thereafter, heat treatment is performed at a temperature of about 700° C. to about 1000° C. so as to make the high-κ film sustainable under a compensation step for deficiency caused by removal of a remaining impurity such as carbon (C) or hydrogen (H) and nitriding and under a thermal budget in a subsequent high-temperature process. The heating atmosphere at this time is preferably a nitrogen ($N_2$) atmosphere containing a trace amount of oxygen ($O_2$) or an ammonium ($NH_3$) atmosphere so as to prevent a large change in thickness of the underlying film between the substrate 101 and the high-κ film 104. Subsequently, in the first embodiment, to prevent Fermi-level pinning caused by reaction between a high-κ material forming a gate insulating film and a conductive material forming a gate electrode for achievement of a desired work function of the gate electrode and a process flow exhibiting excellent uniformity and a high yield, a buffer film 105 made of an insulator is deposited by a CVD process to a thickness of about 0.5 nm over the high-κ film 104 before deposition of a gate-electrode film made of polysilicon. The buffer film 105 may be made of silicon nitride (SiN), silicon oxide ($SiO_2$), titanium oxide ($TiO_2$) or aluminum oxide ($Al_2O_3$). Since titanium oxide has a relative dielectric constant higher than that of silicon oxide, the use of titanium oxide reduces the equivalent oxide thickness EOT. The use of aluminum oxide allows reduction of the threshold voltage $V_t$ of a pMOSFET by negative fixed charge. In this embodiment, a MOSFET using the buffer film 105 made of silicon oxide and a MOSFET not using the buffer film 105 are compared with each other in terms of electrical characteristics.

Subsequently, a gate-electrode film 106 made of phosphorus (P)-doped polysilicon with a thickness of about 100 nm and a hard-mask film 107 made of silicon oxide with a thickness of about 80 nm are deposited in this order by CVD processes over the buffer film 105. Then, resist masks 108 having gate patterns for an nMOSFET and a pMOSFET are formed on the hard-mask film 107 by lithography.

Thereafter, as shown in FIG. 1B, the hard-mask film 107 through the high-κ film 104 are sequentially patterned by dry etching containing chlorine gas ($Cl_2$), for example, as a main component and using the resist masks 108. In this manner, hard masks 107A for n-type and p-type, respectively, are formed out of the hard-mask film 107, gate electrodes 106A for n-type and p-type, respectively, are formed out of the gate-electrode film 106, and gate insulating films 104A for n-type and p-type, respectively, are formed out of the high-κ film 104. Then, ion implantation (extension implantation) is performed on an upper portion of the substrate 101 using the hard masks 107A. Subsequently, side walls 110 made of silicon oxide are formed on both sides of each of the gate electrodes 106A, and then ions are implanted again in an upper portion of the substrate 101 using the side walls 110 and the gate electrodes 106A as a mask, thereby forming n-type source/drain regions 111A in the nMOSFET region and p-type source/drain regions 111B in the pMOSFET region. The extension implantation and source/drain implantation for an nMOSFET are performed separately from the extension implantation and source/drain implantation for a pMOSFET, though the order of implanting an n-type dopant and a p-type dopant is not limited.

Then, as shown in FIG. 1C, an interlayer insulating film 112 made of silicon oxide is deposited by a plasma CVD process over the entire surface of the substrate 101 including the hard masks 107A and the side walls 110. Subsequently, the upper face of the interlayer insulating film 112 is planarized by, for example, a chemical mechanical polishing (CMP) process, thereby exposing the hard masks 107A.

Thereafter, as shown in FIG. 1D, the hard masks 107A, an upper portion of the interlayer insulating film 112 and upper portions of the side walls 110 are etched back using an etching gas containing fluorocarbon as a main component, thereby exposing the gate electrodes 106A.

Subsequently, as shown in FIG. 1E, a metal film 113 made of nickel (Ni) for silicidation of the gate electrodes 106A is deposited by, for example, a sputtering process to a thickness of about 100 nm over the interlayer insulating film 112 from which the gate electrodes 106A are exposed. The metal film 113 may be made of platinum (Pt), instead of nickel.

Then, as shown in FIG. 1F, resist patterns 114 are formed by lithography to mask portions of the metal film 113 located on the n-type and p-type gate electrodes 106A. In this embodiment, the amounts of metal contained in respective portions of the metal film 113 to be left for silicidation on the gate electrodes 106A are changed according to the masked areas of the metal film 113. Specifically, the mask area on the p-type gate electrode 106A is made larger than that on the n-type gate electrode 106A. For example, the mask-area ratio (the mask amount at the p-side/the mask amount at the n-side) is approximately two to three.

Thereafter, the metal film 113 is patterned by dry etching using chlorine gas with the resist patterns 114 used as a mask, thereby forming an n-side metal film 113a for n-type silicide and a p-side metal film 113b for p-type silicide having a plane area larger than that of the n-side metal film 113a. Then, the resist patterns 114 are removed by ashing, thereby obtaining a structure shown in FIG. 1G.

Subsequently, the substrate 101 is subjected to heat treatment at a temperature of about 300° C. to about 600° C. in a nitrogen atmosphere for about one minute, for example, with the n-side metal film 113a and the p-side metal film 113b left thereon. In this manner, the whole gate electrodes 106A are silicided (full silicidation) to be changed into gate electrodes 106B and 106C. Then, the unreacted metal film 113 is removed by selective dry etching using chlorine gas, for example, thereby obtaining dual fully-silicided-gate transistors including the fully-silicided n-side gate electrode 106B and the fully-silicided p-side gate electrode 106C having a metal concentration higher than that of the gate electrode 106B, as shown in FIG. 1H. Etching performed on the unreacted metal film 113 is not limited to dry etching, and wet etching may be used.

In this manner, in the first embodiment, the area of a portion of the metal film 113 used for silicidation of the polysilicon gate electrode 106A at the n-side is different from that at the p-side. i.e., the metal amount at the p-side is larger than that at the n-side. This enables control of metal contents in the fully-silicided n-side and p-side gate electrodes 106B and 106C and, consequently, allows control of work functions in the nMOSFET and the pMOSFET. In this embodiment, as shown in FIG. 8C, the composition of the n-side gate electrode 106B is NiSi and the composition of the p-side gate electrode 106C is $Ni_3Si$. This makes the work function of the p-side gate electrode 106C higher, so that Fermi-level pinning is suppressed especially in the pMOSFET.

In the first embodiment, the metal concentration in nickel silicide is adjusted by utilizing the remaining area of the metal film 113 for silicidation. If the thickness ratio between the polysilicon n-side gate electrode 106A and the n-side metal film 113a is one or less and the thickness ratio between the polysilicon p-side gate electrode 106A and the p-side metal film 113b is two or more, the metal concentration in silicide is more effectively adjusted.

FIGS. 7 and 10 show capacitor characteristics (CV characteristics), equivalent oxide thicknesses EOT and the absolute values of threshold voltages $V_t$ of the nMOSFET including the gate electrode 106B made of NiSi and the pMOSFET including the gate electrode 106C made of $Ni_3Si$ both fabricated in the first embodiment, together with the comparative example. First, in FIG. 7, in the case (represented by ■ and *) of having the same structure as that of the first embodiment and not including a buffer film 105 made of silicon oxide ($SiO_2$), the nMOSFET (■) uses a combination of the HfSiON gate insulating film and the NiSi gate electrode, which is the same as in the comparative example. On the other hand, in the pMOSFET (*) using a combination of the HfSiON gate insulating film and the $Ni_3Si$ gate electrode, the absolute value of the flat band voltage $V_{fb}$ at the accumulation side (where the gate voltage $V_g$>0) is somewhat large and the absolute value of the threshold voltage $V_t$ at the inversion side (where the gate voltage $V_g$<0) is somewhat small accordingly, as compared to the comparative example (represented by □) using a combination of the HfSiON gate insulating film and the NiSi gate electrode. Therefore, the drivability of the transistor (FET) is enhanced in terms of the threshold voltage $V_t$. However, as shown in FIG. 10, the threshold voltage $V_t$ of the pMOSFET in this case is still high, so that it can be estimated that Fermi-level pinning occurs.

As shown in FIG. 10, in the MOSFETs of the first embodiment in which the buffer film 105 of $SiO_2$ is provided between the gate insulating films 104A made of a high-κ material and the gate electrodes 106B and 106C, the equivalent oxide thicknesses EOT increase because of the buffer film 105 and the inversion capacitances decrease, as indicated by ◆ and ◇ in FIG. 7. It is considered that this is because Fermi-level pinning is suppressed though the equivalent oxide thicknesses EOT increase, so that the original work function of nickel silicide is reflected. That is, as shown in FIG. 10, with respect to the MOSFETs using a combination of a HfSiON gate insulating film and a $Ni_xSi$ gate electrode, the absolute value of the threshold voltage $V_t$ is somewhat large in the nMOSFET but is greatly reduced in the pMOSFET, as compared to the MOSFETs of the comparative example and the examples having the same structure as that of the first embodiment except for that no buffer film is provided, i.e., the MOSFETs using a combination of a HfSiON gate insulating film and a NiSi gate electrode. Accordingly, as in the first embodiment, if the buffer film 105 made of a dielectric is provided between the gate insulating film 104 and each of the gate electrodes 106B and 106C, the inversion capacitance decreases as the drivability of the transistor but the threshold voltage $V_t$ is expected to increase.

FIG. 9 shows a relationship between leakage current $J_g$ and transconductance $g_m$ of an nMOSFET fabricated in the first embodiment, together with the comparative example and a structure including no buffer film. As described above, the transconductance $g_m$ is substantially proportional to the inversion capacitance and carrier mobility. As shown in FIG. 9, in the structure (▲) including the comparative example in which no buffer film is provided, the leakage current $J_g$ increases to some extent because of effective decrease of the physical thickness but the transconductance $g_m$ greatly increases because of large increase of the inversion capacitance shown in FIG. 7. In this aspect, it is considered that the drivability of the transistor is greatly enhanced.

On the other hand, in the structure of the first embodiment (Δ) including the buffer film 105 of $SiO_2$, because of increase of the physical thickness corresponding to the thickness of the buffer film 105, the leakage current $J_g$ and the inversion capacitance decrease to some degree and the transconductance $g_m$ also decreases to some extent. However, in this structure, sufficient transistor drivability is maintained, as compared to the structures of the conventional example (represented by ○ and ●) using a combination of a polysilicon electrode and a SiON or HfSiON gate insulating film.

Figure 11B:
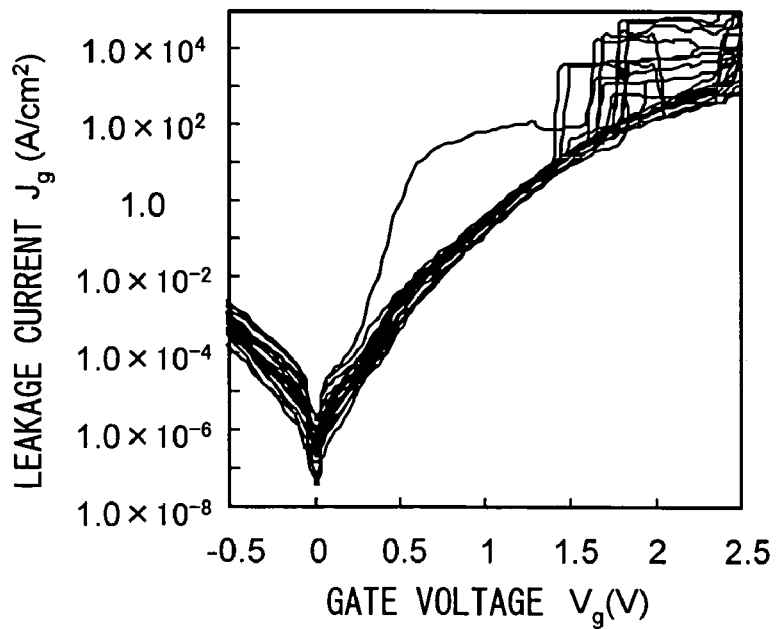

With respect to the absolute value of the leakage current $J_g$ and variation thereof, significant improvement is made in the MOSFETs of the first embodiment including the buffer film 105, as shown in FIG. 11B.

As described above, with the method for fabricating a CMOS device including dual fully-silicided gate electrodes according to the first embodiment, a dual gate structure in which the gate electrodes 106B and 106C having different work functions are used for the respective nMOSFET and pMOSFET is achieved, so that the absolute values of the threshold voltages $V_t$ are reduced. As a result, the drivability of the transistors is enhanced. In particular, when the buffer film 105 is provided between the gate insulating films 104A made of a high-κ material and the fully-silicided gate electrodes 106B and 106C, Fermi-level pinning is suppressed, so that the absolute values of the threshold voltages $V_t$ are reduced, the yield in full silicidation is increased and the reliability of a CMOS device is enhanced.

The composition of nickel silicide forming the gate electrode 106B of the nMOSFET is not necessarily NiSi and the Si concentration may be 50% or more as represented by $NiSi_2$. The composition of nickel silicide forming the gate electrode 106C of the pMOSFET is not necessarily $Ni_3Si$ and the Ni concentration may be 50% or more as represented by $Ni_2Si$.

Embodiment 2

Hereinafter, a method for fabricating a semiconductor device having a CMOS structure according to a second embodiment of the present invention will be described with reference to FIGS. 2A through 2J. In FIGS. 2A through 2J, components also shown in FIGS. 1A through 1H are denoted by the same reference numerals, and the description thereof will be omitted. The process steps shown in FIGS. 2A through 2D are the same as those described in the first embodiment.

First, in the process step shown in FIG. 2D, hard masks 107A made of silicon oxide, an upper portion of an interlayer insulating film 112 and upper portions of side walls 110 in an n-transistor region 1 and a p-transistor region 2 are etched back with an etching gas containing fluorocarbon as a main component, thereby exposing gate electrodes 106A.

Next, as shown in FIG. 2E, a resist pattern 124 is formed on the interlayer insulating film 112 in the n-transistor region 1 or the p-transistor region 2 by lithography to mask a portion of the interlayer insulating film 112 in the n-transistor region 1 at this time.

Then, as shown in FIG. 2F, the upper portion of the polysilicon gate electrode 106A exposed between the side walls 110 in the p-transistor region 2 is selectively etched by dry etching using an etching gas containing chlorine ($Cl_2$) or hydrogen bromide (HBr) as a main component with the resist pattern 124 used as a mask, thereby forming a lower gate electrode 106a. The thickness of the lower gate electrode 106a is preferably a half or less of the thickness of a metal film for silicidation to be deposited on the lower gate electrode 106a in a subsequent step.

Thereafter, as shown in FIG. 2G, the resist pattern 124 is removed, and then a metal film 113 of nickel (Ni) for siliciding the gate electrode 106A and the lower gate electrode 106a is deposited by, for example, a sputtering process to a thickness of about 100 nm over the interlayer insulating film 112 from which the gate electrode 106A and the lower gate electrode 106a are exposed. At this time, the thickness of a portion of the metal film 113 located on the lower gate electrode 106a is large, so that a thick portion 113c is formed on the lower gate electrode 106a.

Subsequently, as shown in FIG. 2H, a resist pattern 125 is formed on the metal film 113 by lithography to mask a portion of the metal film 113 in the p-transistor region 2 at this time.

Then, the metal film 113 is etched by dry etching using chlorine ($Cl_2$) as a main component with the resist pattern 125 used as a mask, thereby forming a thin portion 113d in a portion of the metal film 113 in the n-transistor region 1. Thereafter, the resist pattern 125 is removed by ashing, thereby obtaining the structure shown in FIG. 2I. The thickness of the thin portion 113d is preferably equal to or less than that of the n-side gate electrode 106A.

Subsequently, the substrate 101 is subjected to heat treatment at a temperature of about 300° C. to about 600° C. in a nitrogen atmosphere for about one minute, for example, with the metal film 113 including the thick portion 113c and the thin portion 113d formed thereon. In this manner, the entire portions of the gate electrode 106A and the lower gate electrode 106a are silicided (full silicidation) to be changed into gate electrodes 106B and 106C. Thereafter, the unreacted metal film 113 is removed by selective dry etching using chlorine gas, thereby obtaining dual fully-silicided-gate transistors including the fully-silicided n-side gate electrode 106B and the fully-silicided p-side gate electrode 106C having a metal concentration higher than that in the gate electrode 106B, as shown in FIG. 2J.

In the second embodiment, the thickness of a portion of the metal film 113 for siliciding the polysilicon gate electrode 106A at the n-side is different from that at the p-side, i.e., the metal amount at the p-side is larger than that at the n-side. In this case, as described above, the thickness ratio of the thin portion 113d of the metal film 113 with respect to the gate electrode 106A is preferably one or less, and the thickness ratio of the thick portion 113c of the metal film 113 with respect to the lower gate electrode 106a is preferably two or more. This enables control of the metal-content ratio between the fully-silicided n-side gate electrode 106B and the fully-silicided p-side gate electrode 106C and, consequently, allows control of work functions between the nMOSFET and the pMOSFET. In this embodiment, as shown in FIG. 8C, the composition of the n-side gate electrode 106B is NiSi and the composition of the p-side gate electrode 106C is $Ni_3Si$. This makes the work function of the p-side gate electrode 106C higher, so that Fermi-level pinning is suppressed especially in the pMOSFET.

Electrical characteristics of the semiconductor device of the second embodiment are similar to those of the first embodiment. However, the method of the second embodiment further ensures formation of the p-side gate electrode 106C having a metal concentration higher than that of the n-side gate electrode 106B, as compared to the method of the first embodiment.

In the second embodiment, as shown in FIG. 2F, an upper portion of the gate electrode 106A in the p-transistor region 2 is removed. Alternatively, an upper portion of the gate electrode 106A in the n-transistor region 1 may be removed. In such a case, instead of nickel or platinum, tantalum (Ta) or titanium (Ti) may be used for the metal film 113. This is because the work function of tantalum is lower than 4.61 eV, which is the energy at the midgap of silicon, so that the metal concentration in the n-side gate electrode 106B is preferably higher than that of the p-side gate electrode 106C for suppression of Fermi-level pinning in the nMOSFET.

Embodiment 3

Hereinafter, a method for fabricating a semiconductor device having a CMOS structure according to a third embodiment of the present invention will be described with reference to FIGS. 3A through 3K. In FIGS. 3A through 3K, components also shown in FIGS. 1A through 1H are denoted by the same reference numerals, and the description thereof will be omitted. The process steps shown in FIGS. 3A through 3C are the same as those described in the first embodiment.

First, as shown in FIG. 3C, an interlayer insulating film 112 made of silicon oxide is deposited over the entire surface of a substrate 101 including hard masks 107A and side walls 110. Subsequently, the upper face of the interlayer insulating film 112 is planarized by, for example, a CMP process, thereby exposing the hard masks 107A.

Next, as shown in FIG. 3D, a resist pattern 124 is formed on the interlayer insulating film 112 in an n-transistor region 1 or the p-transistor region 2 by lithography to mask the n-transistor region 1 at this time.

Then, as shown in FIG. 3E, the hard mask 107A, an upper portion of the interlayer insulating film 112 and upper portions of the side walls 110 in the p-transistor region 2 are etched back by dry etching using fluorocarbon as a main component with the resist pattern 124 used as a mask, thereby exposing a p-side gate electrode 106A.

Thereafter, as shown in FIG. 3F, the resist pattern 124 is removed, and then a first metal film 113 made of nickel (Ni) for siliciding the p-side gate electrode 106A is deposited by, for example, a sputtering process to a thickness of about 100 nm over the interlayer insulating film 112 from which the hard mask 107A is exposed in the n-transistor region 1 and the gate electrode 106A is exposed in the p-transistor region 2.

Subsequently, the substrate 101 is subjected to heat treatment at a temperature of about 300° C. to about 600° C. in a nitrogen atmosphere for about one minute, for example, with the first metal film 113 formed thereon. In this manner, the whole p-side gate electrode 106A is silicided (full silicidation) to be changed into a gate electrode 106C. Thereafter, the unreacted first metal film 113 is removed by selective dry etching using chlorine gas, thereby obtaining a fully-silicided p-side gate electrode 106C having a metal concentration (Ni concentration) exceeding 0.5 (50%) as shown in FIG. 3G.

Then, as shown in FIG. 3H, a resist pattern 125 is formed on the interlayer insulating film 112 in the p-transistor region 2 by lithography to mask the interlayer insulating film 112 and the gate electrode 106C at this time.

Thereafter, as shown in FIG. 3I, the hard mask 107A, an upper portion of the interlayer insulating film 112 and upper portions of the side walls 110 in the n-transistor region 1 are etched back by dry etching using fluorocarbon as a main component with the resist pattern 125 used as a mask, thereby exposing the n-side gate electrode 106A.

Subsequently, as shown in FIG. 3J, the resist pattern 125 is removed, and then a second metal film 123 for siliciding the gate electrode 106A and the gate electrode 106C is deposited by, for example, a sputtering process to a thickness of about 100 nm over the interlayer insulating film 112 from which the n-side gate electrode 106A and the p-side gate electrode 106C are exposed.

Then, the substrate 101 is subjected to heat treatment at a temperature of about 300° C. to about 600° C. in a nitrogen atmosphere for about one minute, for example, with the second metal film 123 formed thereon. In this manner, the whole n-side gate electrode 106A is silicided to be changed into a gate electrode 106B. At the p-side, nickel atoms in nickel silicide are further excessively introduced into the gate electrode 106C. Thereafter, the unreacted second metal film 123 is removed by selective dry etching using chlorine gas, thereby obtaining dual fully-silicided-gate transistors including the fully-silicided n-side gate electrode 106B and the fully-silicided p-side gate electrode 106C having a metal concentration higher than that of the gate electrode 106B, as shown in FIG. 3K.

In the third embodiment, during silicidation of the polysilicon gate electrodes 106A, the composition of nickel silicide is determined through two silicidation processes performed on the p-side gate electrode 106A shown in FIGS. 3F and 3J. Accordingly, in this embodiment, as shown in FIG. 8C, the composition of the n-side gate electrode 106B is NiSi and the composition of the p-side gate electrode 106C is Ni$_3$Si. This makes the work function of the p-side gate electrode 106C higher, so that Fermi-level pinning is suppressed especially in the pMOSFET.

Electrical characteristics of the semiconductor device of the third embodiment are similar to those of the first embodiment.

In the third embodiment, the composition of the p-side gate electrode 106C is determined through the two silicidation processes shown in FIGS. 3F and 3J. If the metal concentration in the gate electrode 106C is higher than (50% or more of) that in silicon and the second silicidation process shown in FIG. 3J is unnecessary, this second silicidation process does not need to be performed. In such a case, it is sufficient to mask the p-side gate electrode 106C with a resist film or the like such that the proportion of metal in the p-side gate electrode 106C that has excessively reacted with Ni in the second metal film 123 at the previous step does not vary.

Embodiment 4

Hereinafter, a method for fabricating a semiconductor device having a CMOS structure according to a fourth embodiment of the present invention will be described with reference to FIGS. 4A through 4L. In FIGS. 4A through 4L, components also shown in FIGS. 1A through 1H are denoted by the same reference numerals, and the description thereof will be omitted. The process steps shown in FIGS. 4A through 4E are the same as those described in the first embodiment.

First, as shown in FIG. 4E, a hard mask 107A, an upper portion of an interlayer insulating film 112 and upper portions of side walls 110 in a p-transistor region 2 are etched back by dry etching using fluorocarbon as a main component with a resist pattern 124 used as a mask, thereby exposing a p-side gate electrode 106A.

Next, as shown in FIG. 4F, the polysilicon gate electrode 106A exposed between the side walls 110 in the p-transistor region 2 is selectively etched by dry etching using an etching gas containing chlorine (Cl$_2$) or hydrogen bromide (HBr) as a main component with the resist pattern 124 used as a mask, thereby exposing a buffer film 105 formed under the gate electrode 106A.

Thereafter, as shown in FIG. 4G, the resist pattern 124 is removed, and then a first metal film 115 made of platinum (Pt) for metallizing the p-side gate electrode is deposited by, for example, a sputtering or CVD process to a thickness of about 20 nm over the interlayer insulating film 112 from which a hard mask 107A is exposed in an n-transistor region 1 and the buffer film 105 is exposed in the p-transistor region 2.

Subsequently, as shown in FIG. 4H, a resist pattern 125 is formed on the first metal film 115 by lithography to mask a portion of the first metal film 115 located in the p-transistor region 2.

Then, as shown in FIG. 4I, the first metal film 115 is etched back to be removed by dry etching using chlorine as a main component with the resist pattern 125 used as a mask. Subsequently, the hard mask 107A, an upper portion of the interlayer insulating film 112 and upper portions of side walls 110 in the n-transistor region 1 are etched back by dry etching using fluorocarbon as a main component, thereby exposing an n-side gate electrode 106A. In this manner, a metal-gate film 115a is formed out of the first metal film 115 in the p-transistor region 2. This metal-gate film 115a covers the inner bottom and wall of a recess formed by the two side walls 110 and the buffer film 105.

Thereafter, as shown in FIG. 4J, the resist pattern 125 is removed, and then a second metal film 116 made of nickel (Ni) for siliciding the n-side gate electrode 106A is deposited by, for example, a sputtering process to a thickness of about 100 nm over the interlayer insulating film 112 from which the n-side gate electrode 106A and the p-side metal-gate film 115a are exposed.

Subsequently, as shown in FIG. 4K, a substrate 101 is subjected to heat treatment at a temperature of about 300° C. to about 600° C. in a nitrogen atmosphere for about one minute, for example, with the second metal film 116 formed thereon. In this manner, the whole n-side gate electrode 106A is silicided to be changed into a gate electrode 106B. At the same time, a gate electrode 106D made of an alloy of platinum and nickel is formed out of the p-side gate-electrode film 115a.

Then, the unreacted first and second metal films 115 and 116 are removed by selective dry etching using chlorine gas, thereby obtaining dual fully-silicided-gate transistors including the fully-silicided n-side gate electrode 106B and the metallized p-side gate electrode 106D, as shown in FIG. 4L.

In the fourth embodiment, a portion of the p-side gate-electrode film 115a is changed into an alloy through the full silicidation shown in FIG. 4K. Accordingly, for the p-side gate electrode 106D, the work function of the gate electrode 106D that has been changed into an alloy itself needs to be considered as a design value or the gate-electrode film 115a (the first metal film 115) needs to be deposited to have a large thickness so as to prevent a portion in contact with the gate insulating film 104A as well as the buffer film 105 from changing into an alloy. In addition, before deposition of the second metal film 116 for silicidation shown in FIG. 4J, a protection film made of, for example, titanium nitride (TiN) needs to be deposited as an alloy-preventing layer over the gate-electrode film 115a.

In the nMOSFET, the thickness ratio of the second metal film 116 with respect to the gate electrode 106A is preferably one or less. Then, the Ni concentration in nickel silicide (NiSi) forming the fully-silicided n-side gate electrode 106B is set at 50% or less.

In the fourth embodiment, the p-side gate electrode 106D is metallized by using platinum and nickel. Conversely, the n-side gate electrode 106C may be metallized and the p-side gate electrode 106D may be fully silicided. In such a case, instead of platinum, tantalum (Ta), titanium (Ti) or nitrides containing these elements can be used for the first metal film 115.

Electrical characteristics of the MOSFETs forming the semiconductor device of the fourth embodiment will be described in the following fifth embodiment.

Embodiment 5

Hereinafter, a method for fabricating a semiconductor device having a CMOS structure according to a fifth embodiment of the present invention will be described with reference to FIGS. 5A through 5K. In FIGS. 5A through 5K, components also shown in FIGS. 1A through 1H are denoted by the same reference numerals, and the description thereof will be omitted. The process steps shown in FIGS. 5A through 5C are the same as those described in the first embodiment.

First, as shown in FIG. 5C, an interlayer insulating film 112 made of silicon oxide is deposited over the entire surface of a substrate 101 including hard masks 107A and side walls 110. Subsequently, the upper face of the interlayer insulating film 112 is planarized by, for example, a CMP process, thereby exposing the hard masks 107A.

Next, as shown in FIG. 5D, a resist pattern 124 is formed on the interlayer insulating film 112 in an n-transistor region 1 or a p-transistor region 2 by lithography to mask the p-transistor region 2 at this time.

Then, as shown in FIG. 5E, the hard mask 107A, an upper portion of the interlayer insulating film 112 and upper portions of the side walls 110 in the n-transistor region 1 are etched back by dry etching using fluorocarbon as a main component with the resist pattern 124 used as a mask, thereby exposing an n-side gate electrode 106A.

Thereafter, as shown in FIG. 5F, the polysilicon gate electrode 106A exposed between the side walls 110 in the n-transistor region 1 is selectively etched by dry etching using an etching gas containing chlorine ($Cl_2$) or hydrogen bromide (HBr) as a main component with the resist pattern 124 used as a mask, thereby exposing a buffer film 105 under the gate electrode 106A.

Subsequently, as shown in FIG. 5G, the resist pattern 124 is removed, and then a conductive film 117 made of tantalum silicon nitride (TaSiN) for matallizing the n-side gate electrode is deposited by, for example, a sputtering or CVD process to a thickness of about 20 nm over the interlayer insulating film 112 from which the buffer film 105 is exposed in the n-transistor region 1 and the hard mask 107A is exposed in the p-transistor region 2.

Then, as shown in FIG. 5H, a resist pattern 125 is formed on the conductive film 117 by lithography to mask a portion of the conductive film 117 located in the n-transistor region 1.

Thereafter, as shown in FIG. 5I, the conductive film 117 is etched back to be removed by dry etching using chlorine as a main component with the resist pattern 125 used as a mask. Subsequently, the hard mask 107A, an upper portion of the interlayer insulating film 112 and upper portions of the side walls 110 in the p-transistor region 2 are etched back by dry etching using fluorocarbon as a main component, thereby exposing the p-side gate electrode 106A. Then, the polysilicon gate electrode 106A exposed between the side walls 110 in the p-transistor region 2 is selectively etched by dry etching using an etching gas containing chlorine ($Cl_2$) or hydrogen bromide (HBr) as a main component, thereby exposing the buffer film 105 under the gate electrode 106A. In this manner, a metal-gate film 117a is formed out of the conductive film 117 in the n-transistor region 1. This metal-gate film 117a covers the inner bottom and wall of a recess formed by the two side walls 110 and the buffer film 105.

Then, as shown in FIG. 5J, the resist pattern 125 is removed, and then a metal film 118 made of platinum (Pt) for metallizing the p-side gate electrode is deposited by, for example, a sputtering process to a thickness of about 20 nm over the interlayer insulating film 112 from which the n-side metal-gate film 117a and the p-side buffer film 105 are exposed.

Thereafter, as shown in FIG. 5K, the unreacted conductive film 117 and metal film 118 are removed by selective dry etching using chlorine gas and a CMP process, thereby obtaining dual metal-gate transistors including an n-side gate electrode 106E metallized by using TaSiN and Pt and a p-side gate electrode 106D metallized by using Pt.

In the fifth embodiment, a portion of the n-side gate-electrode film 117a is changed into an alloy through the p-side metal-gate formation shown in FIG. 5J. Accordingly, for the n-side gate electrode 106E, the work function of the gate electrode 106E changed into an alloy itself needs to be considered as a design value or the gate-electrode film 117a (the conductive film 117) needs to be deposited to have a large thickness so as to prevent a portion in contact with the gate insulating film 104A as well as the buffer film 105 from changing into an alloy. In addition, before deposition of the metal film 118 shown in FIG. 5J, a protection film made of, for example, titanium nitride (TiN) needs to be deposited as an alloy-preventing layer over the gate-electrode film 117a.

Hereinafter, characteristics of the semiconductor device of the fifth embodiment will be described with reference to the drawings together with characteristics of the semiconductor device of the fourth embodiment.

FIGS. 7 and 10 show capacitor characteristics (CV characteristics), the equivalent oxide thicknesses EOT and the absolute values of the threshold voltages $V_t$ of the nMOSFETs including the gate electrodes 106B and 106E and pMOSFETs including the gate electrodes 106D fabricated in the fourth and fifth embodiments, together with the comparative example. The nMOSFET represented by ♦ and the pMOSFET represented by ◊ correspond to the fourth embodiment, and the nMOSFET represented by − and the pMOSFET represented by + correspond to the fifth embodiment.

In a structure in which no buffer film 105 made of silicon oxide ($SiO_2$) is provided between a gate insulating film and a gate electrode, a metal material forming the gate electrode and a high-κ material of metal oxide forming the gate insulating film react with each other, resulting in that even a noble metal such as platinum cannot obtain its original work function and the threshold voltage $V_t$ tends to increase. Accordingly, it is estimated that Fermi-level pinning occurs. However, in a structure in which the buffer film 105 is provided, the equivalent oxide thicknesses EOT of both the nMOSFET and the pMOSFET increase as shown in FIG. 10. As shown in FIG. 7, this increase of the equivalent oxide thicknesses EOT causes the inversion capacitances of both the nMOSFET and the pMOSFET to decrease. That is, though the equivalent oxide thicknesses EOT increase, the original work functions are reflected. It seems that this is because Fermi-level pinning is suppressed. The absolute values of the threshold voltages $V_t$ of the nMOSFET represented by − and the pMOSFET represented by + are smaller than those of the nMOSFET of the comparative example and the first through fourth embodiments represented by ♦ and the pMOSFET of the first through third embodiments represented by ◊.

In this manner, in the fifth embodiment, as the drivability of a transistor, the inversion capacitance is reduced because of provision of the buffer film 105, but a capacitance value much larger than that in the structure of the conventional example (●) is maintained. Accordingly, in the semiconductor device of the fifth embodiment, increase of the threshold voltages $V_t$ is suppressed, so that further improvement in electrical characteristics is expected.

FIG. 9 shows a relationship between leakage current $J_g$ and transconductance $g_m$ of the nMOSFET fabricated in the fifth embodiment, together with the structures of the comparative example and other embodiments. As described above, the transconductance $g_m$ is substantially proportional to the inversion capacitance and the carrier mobility. Accordingly, the leakage current $J_g$ and the transconductance $g_m$ of the structure of the fifth embodiment (□) are almost equal to those in the structure of another embodiment (△). Therefore, the drivability of a transistor is sufficiently greater than that in the conventional structure (○) in which a polysilicon electrode and a SiON gate insulating film are combined.

In addition, the MOSFETs of the fifth embodiments exhibit the most excellent electrical characteristics in total because increase in the absolute values of the threshold voltages $V_t$ is suppressed, as shown in FIG. 10.

As described above, with the method for fabricating a semiconductor device having a CMOS structure according to the fifth embodiment, a dual gate structure in which metal gate electrodes having different work functions are provided for an nMOSFET and a pMOSFET, respectively, is implemented, and the increase of threshold voltages $V_t$ during transistor operation is sufficiently suppressed. As a result, the drivability of transistors is greatly enhanced.

With a semiconductor device and a method for fabricating the device according to the present invention, a dual gate structure in which full-silicidation or metallization is performed by using metals having work functions suitable for respective p- and n-transistors is achieved for a CMOS device using a high-κ material for a gate insulating film. Therefore, the present invention is useful for a CMOS device including a gate insulating film made of a high-κ material and a method for fabricating the device.

What is claimed is:

1. A semiconductor device, comprising:
    an n-transistor including a first gate insulating film made of a high-dielectric-constant material and a first gate electrode, the first gate insulating film and the first gate electrode being formed in this order over a semiconductor region; and
    a p-transistor including a second gate insulating film made of the high-dielectric-constant material and a second gate electrode made of a conductive film containing a first metal, the second gate insulating film and the second gate electrode being formed in this order over the semiconductor region,
    wherein the first metal has a work function larger than a Fermi level in potential energy of electrons of silicon; and
    at least one of the first gate electrode and the second gate electrode is a fully-silicided gate and the other is a metal gate.

2. The semiconductor device of claim 1, wherein the first gate electrode is fully silicided with a second metal.

3. The semiconductor device of claim 1, wherein the first gate electrode is made of a conductive film containing a second metal.

4. The semiconductor device of claim 1, wherein the first metal contains nickel or platinum as a main component.

5. The semiconductor device of claim 1, wherein the high-dielectric-constant material contains at least one metal selected from the group consisting of silicon, germanium, hafnium, zirconium, titanium, tantalum, aluminum and a rare-earth metal.

6. The semiconductor device of claim 1, wherein a buffer film made of an insulator is formed at least one of between the first gate insulating film and the first gate electrode and between the second gate insulating film and the second gate electrode.

7. The semiconductor device of claim 6, wherein the buffer film is made of silicon nitride, silicon oxide, titanium oxide or aluminum oxide.

* * * * *